United States Patent
Hofmayer et al.

(10) Patent No.: US 8,148,997 B2
(45) Date of Patent: Apr. 3, 2012

(54) METHOD FOR MONITORING WHETHER THE SWITCHING THRESHOLD OF A SWITCHING TRANSDUCER LIES WITHIN A PREDEFINED TOLERANCE RANGE

(75) Inventors: Matthias Hofmayer, Römerberg (DE); Michael Kindermann, Mannheim (DE)

(73) Assignee: Pepperl + Fuchs GmbH, Mannheim (DE)

( * ) Notice: Subject to any disclaimer, the term of this patent is extended or adjusted under 35 U.S.C. 154(b) by 416 days.

(21) Appl. No.: 12/311,927

(22) PCT Filed: Oct. 22, 2007

(86) PCT No.: PCT/DE2007/001873
§ 371 (c)(1),
(2), (4) Date: Jun. 17, 2009

(87) PCT Pub. No.: WO2008/046415
PCT Pub. Date: Apr. 24, 2008

(65) Prior Publication Data
US 2010/0026369 A1    Feb. 4, 2010

(30) Foreign Application Priority Data

Oct. 20, 2006   (DE) .......................... 10 2006 050 399
Oct. 28, 2006   (DE) .......................... 10 2006 051 312

(51) Int. Cl.
*G01R 31/02* (2006.01)
(52) U.S. Cl. ....................................................... 324/537
(58) Field of Classification Search .................. None
See application file for complete search history.

(56) References Cited

U.S. PATENT DOCUMENTS 4,714,915 A * 12/1987 Hascal et al. ................. 340/657
2005/0189950 A1   9/2005 Lu

FOREIGN PATENT DOCUMENTS

WO    WO 03/046590    6/2003

OTHER PUBLICATIONS

International Search Report PCT/DE2007/001873 Jul. 30, 2008.
English translation of the International Preliminary Report and Patentability and Written Opinion of the International Searching Authority for PCT/DE2007/001873 May 5, 2009.

* cited by examiner

Primary Examiner — Paresh Patel
(74) Attorney, Agent, or Firm — Collard & Roe, P.C.

(57) ABSTRACT

A method monitors whether the switching threshold of a switching sensor lies within a predefined tolerance region. An input signal is applied to the sensor's signal input, and a signal output emits a switch output signal that takes a first value when the input signal exceeds the switching threshold and, otherwise, takes a second value. A modulator generates a modulator signal used as an input signal that changes continuously or cyclically between an output value defining the upper limit and a smaller test value defining the lower limit of the tolerance region. The switch output signal pulses synchronously with the modulator signal between the first and second values when the switching threshold lies within the tolerance region and otherwise does not pulse. An evaluation device monitors the pulsation, an alarm signal being triggered when the switch output signal does not pulse for at least a predefined test period.

28 Claims, 8 Drawing Sheets

US 8,148,997 B2

METHOD FOR MONITORING WHETHER THE SWITCHING THRESHOLD OF A SWITCHING TRANSDUCER LIES WITHIN A PREDEFINED TOLERANCE RANGE

CROSS REFERENCE TO RELATED APPLICATIONS

This application is the National Stage of PCT/DE2007/001873 filed on Oct. 22, 2007, which claims priority under 35 U.S.C. §119 of German Application No. 10 2006 050 399.6 filed on Oct. 20, 2006 and German Application No. 10 2006 051 312.6 filed Oct. 28, 2006. The international application under PCT article 21(2) was not published in English.

BACKGROUND OF THE INVENTION

1. Field of the Invention

The invention relates to a method for monitoring whether the switching threshold of a switching transducer, especially of a comparator, lies within a predefined tolerance range or not.

2. Description of the Related Art

In numerous applications, switching processes take place as a function of measured values or signal quantities. For instance—to name just a few of numerous applications by way of an example—for purposes of the two-point regulation of a temperature, for monitoring the internal pressure in a pressure vessel, for limiting the current in a cable, for brightness-dependent switching street lamps on and off, for triggering smoke alarms and sprinkler systems in case of fire, for operating anti-collision proximity sensors, for operating an anti-blocking system or a brake wear display in a vehicle, or for automatically switching off an industrial robot when a person approaches, there can be a need to trigger a switching procedure when a measured value or other signal exceeds or falls below a predefined threshold value. The threshold value thus defines a switching threshold.

These examples already show that malfunctions with such switching procedures can not only disrupt an operational sequence but also endanger considerable material values and especially the safety of humans.

During such switching procedures, malfunctions can be caused especially in that the threshold value moves away from a target value without being noticed, i.e. drifts uncontrolled. Such a switching threshold drift can be the result of, for example, temperature fluctuations, ageing, dirt, wear and tear, or production flaws in components; in the case of systems controlled by computers or microprocessors, the possible causes can also include software errors and program crashes.

SUMMARY OF THE INVENTION

The invention is based on the objective of putting forward a method with which it is possible to monitor whether the switching threshold of a switching transducer lies within a tolerance range, whereby the method should especially be useable for monitoring an electrical signal for drift as well as for monitoring the switching threshold for drift in switching procedures of the above-mentioned type, especially in the case of switching procedures that make use of components in which the drift of electric parameters cannot or must not be ruled out, and also for reducing the risk of undiscovered failures in switching devices.

This objective is achieved according to the invention by a method for monitoring whether the switching threshold of a switching transducer, especially of a comparator, lies within a predefined tolerance range or not, whereby the switching transducer has a signal input at which an input signal is present, as well as a switching output and, via the switching output, it emits a switching output signal that takes on a first value if the input signal is greater than the switching threshold, and otherwise, it takes on a second value, characterized in that a) as the input signal, a modulator signal generated by a modulator is used, said modulator signal changing continuously or cyclically between an output value that specifies the upper limit of the tolerance range and attest value that is smaller than the output value and that specifies the lower limit of the tolerance range, so that the switching output signal then pulsates synchronously with the modulator signal between the first value and the second value when the switching threshold of the switching transducer lies within the tolerance range, and otherwise, it does not pulsate, b) and the switching output signal is monitored for pulsation by means of an evaluation unit and an alarm signal is triggered if the switching output signal does not pulsate for at least a predefined test time period.

In an advantageous manner, the invention puts forward a method with which it is possible to monitor whether the switching threshold of a switching transducer lies within a tolerance range. Here, the method is especially useable for monitoring an electrical signal for drift as well as for monitoring the switching threshold for drift in switching procedures of the above-mentioned type, especially in the case of switching procedures that make use of components in which the drift of electric parameters cannot or must not be ruled out. By the same token, the risk of undiscovered failures in switching devices is reduced.

The test time period is preferably longer than the maximum pulse length of the switching output signal, i.e. longer than the maximum duration during which the switching output signal uninterruptedly takes on the first value, and also longer than the maximum duration during which the switching output signal uninterruptedly takes on the second value. These two durations do not necessarily have to be equally long. The pulsation of the modulator signal can be periodical or aperiodical.

The switching transducer is an electric switching transducer that is capable of responding to an electric signal and in this process, of completing a switching procedure. The switching threshold refers to the electric switching threshold of the electric switching transducer.

The test time period is preferably selected to be x times longer than the maximum pulse length of the switching output signal, whereby x is a number greater than 1. For example, x can be a number between 2 and 10.

Therefore, the alarm signal indicates that the switching threshold lies outside of the tolerance range or that it has been outside of the tolerance range, at least during the test time period.

A circuit for monitoring the switching threshold of a switching transducer for deviation from a target value comprises an evaluation unit and a modulator, whereby A) the switching transducer has at least one signal input and one signal output, B) the modulator emits, at least at times, a modulator signal to the signal input of the switching transducer, said modulator signal changing continuously or cyclically between an output value that is greater than the target value and a test value that is smaller than the target value, C) the switching transducer emits a switching output signal that takes on a first value if the modulator signal is greater than the switching threshold, and otherwise, it takes on a second value, so that the switching output signal then pulsates synchronously with the modulator signal between the first value and the second value when the switching threshold of the switching transducer lies between the output value and the test value, and thus deviates from the target value at the maximum by a predefined tolerance, and otherwise, it does not pulsate, D) the evaluation unit monitors the switching output signal for pulsation and triggers an alarm signal if the switching output signal does not pulsate for at least a predefined test time period.

According to a variant, the invention relates to a method for monitoring the switching threshold of a switching transducer for deviation from a target value, making use of an evaluation unit and a modulator, whereby the switching transducer has at least one signal input and one signal output, comprising the following steps:

a) the modulator generates a modulator signal, at least at times, said modulator signal changing continuously or cyclically between an output value that is greater than the target value and a test value that is smaller than the target value, b) the switching transducer is actuated with the modulator signal via the signal input, c) the switching transducer generates a switching output signal and emits it via the switching output, said switching output signal taking on a first value if the modulator signal is greater than the switching threshold, and otherwise taking on a second value, so that the switching output signal then pulsates synchronously with the modulator signal between the first value and the second value when the switching threshold of the switching transducer lies between the output value and the test value, and thus deviates from the target value at the maximum by a predefined tolerance, and otherwise, it does not pulsate, d) the evaluation unit is actuated with the switching output signal, e) the evaluation unit monitors the switching output signal for pulsation and it triggers an alarm signal if the switching output signal does not pulsate for at least a predefined test time period.

A circuit for monitoring an electric signal, e.g. an external signal, for deviation from a target value comprises an evaluation unit, a modulator and a switching transducer with a predefined switching threshold, whereby AA) the switching transducer has at least one signal input and one switching output, BB) either the switching threshold is smaller than the target value and the modulator, at least at times, emits a modulator signal to the signal input of the switching transducer, said modulator signal changing continuously or cyclically between an output value that, at least at a starting point in time, is equal to the target value and greater than the switching threshold and a test value that, at least at the starting point in time, is smaller than the switching threshold, so that the output value and the test value form the limits of a tolerance range within which the switching threshold lies, at least at the starting point in time, BB') or the switching threshold is greater than the target value and the modulator, at least at times, emits a modulator signal to the signal input of the switching transducer, said modulator signal changing continuously or cyclically between an output value that, at least at a starting point in time, is greater than the switching threshold and a test value that, at least at the starting point in time, is equal to the target value and smaller than the switching threshold, so that the output value and the test value form the limits of a tolerance range within which the switching threshold lies, at least at the starting point in time, CC) the switching transducer emits an output signal that takes on a first value if the modulator signal is greater than the switching threshold, and otherwise, it takes on a second value, so that the output signal then pulsates synchronously with the modulator signal between the first value and the second value when the switching threshold lies within the tolerance range and thus the electric signal deviates from the target value at the maximum by a predefined tolerance, and otherwise, the output signal does not pulsate, DD) the evaluation unit monitors the output signal for pulsation and triggers an alarm signal if the output signal does not pulsate for at least a predefined test time period, and thus the alarm signal indicates that the tolerance range no longer encompasses the switching threshold and thus the electric signal deviates from the target value by more than the predefined tolerance.

According to another variant, the invention relates to a method for monitoring an electric signal for deviation from a target value, making use of an evaluation unit, a modulator and a switching transducer with a predefined switching threshold, whereby aa) the switching transducer has at least one signal input and one switching output, bb) either the switching threshold is smaller than the target value and the modulator, at least at times, emits a modulator signal to the signal input of the switching transducer, said modulator signal changing continuously or cyclically between an output value that, at least at a starting point in time, is equal to the target value and greater than the switching threshold and a test value that, at least at the starting point in time, is smaller than the switching threshold, so that the output value and the test value form the limits of a tolerance range within which the switching threshold lies, at least at the starting point in time, bb') or the switching threshold is greater than the target value and the modulator, at least at times, emits a modulator signal to the signal input of the switching transducer, said modulator signal changing continuously or cyclically between an output value that, at least at a starting point in time, is greater than the switching threshold and a test value that, at least at the starting point in time, is equal to the target value and smaller than the switching threshold, so that the output value and the test value form the limits of a tolerance range within which the switching threshold lies, at least at the starting point in time, cc) the switching transducer generates and emits an output signal that takes on a first value if the modulator signal is greater than the switching threshold, and otherwise, it takes on a second value, so that the output signal then pulsates synchronously with the modulator signal between the first value and the second value when the switching threshold lies within the tolerance range and thus the electric signal deviates from the target value at the maximum by a predefined tolerance, and otherwise, the output signal does not pulsate, dd) the evaluation unit monitors the output signal for pulsation and an alarm signal is triggered if the output signal does not pulsate for at least a predefined test time period, the alarm signal thus indicating that the tolerance range no longer encompasses the switching threshold and thus the electric signal deviates from the target value by more than the predefined tolerance.

Therefore, the modulator functions as a pulse transmitter or pulse generator. The term switching transducer refers to a component or circuit that performs a switching procedure as soon as a signal that is present at the component or circuit exceeds or falls below a switching threshold. The switching transducer can be, for example, a comparator, an optocoupler, a transistor, a thyristor or a difference amplifier. The pulsation frequency of the modulator signal can be, for example, 1 kHz. The evaluation unit can be, for instance, a microprocessor.

The output value is the upper limit of the tolerance range, while the test value is the lower limit of the tolerance range. The tolerance range is thus the range in which the switching threshold can lie, without the alarm signal being triggered. If the switching threshold does not lie within the tolerance range, the alarm signal is triggered. The switching threshold can leave the tolerance range in that it drifts beyond one of its two limits, or else in that, conversely, the tolerance range changes in such a way that the switching threshold is no longer within the tolerance range. The first case is especially suitable for monitoring the switching threshold for drift, and the second case is suitable for monitoring any desired electric signal for drift, insofar as the tolerance range accompanies the drift of the signal.

The method according to the invention can serve for monitoring the switching threshold for drift as well as for monitoring the limits of the tolerance range for drift. According to a variant of the method, the tolerance range or the limits of the tolerance range accompany an electric signal or an external signal and, as a result, the electric signal or the external signal is monitored for drift.

The circuit can be capable of causing the tolerance range to accompany the drift of the electric signal that is to be monitored and of triggering the alarm signal if the tolerance range does not encompass the switching threshold. Therefore, on the basis of a variant of the method according to the invention, the switching threshold at a starting point in time is within the tolerance range, whereby the tolerance range accompanies the drift of the electric signal that is to be monitored, and the alarm signal is triggered when the tolerance range no longer encompasses the switching threshold. Preferably, the upper limit or the lower limit of the tolerance range is the same as the signal that is to be monitored or the external signal that is to be monitored. According to another variant, the signal that is to be monitored is greater than the output value; according to another variant, the signal that is to be monitored is smaller than the test value; according to another variant, the signal that is to be monitored is greater than the test value, but smaller than the output value.

A2 According to a preferred variant, the output value and the test value are each kept constant or else each kept constant on the average over time, so that the alarm signal indicates a drift of the switching threshold to outside of the tolerance range. Therefore, according to this variant, the switching threshold is monitored for drift.

A3 According to a preferred variant, the switching transducer is a comparator with a reference input, whereby the switching threshold is predefined by a reference voltage present at the reference input, so that a drift of the reference voltage brings about a drift of the switching threshold and therefore the alarm signal indicates a drift of the reference voltage by more than a certain tolerance amount. Therefore, according to this variant, the reference voltage is monitored for drift.

A4 Preferably, a target value is predefined for the switching threshold, said target value being smaller than the output value and greater than the test value, so that the alarm signal indicates that the switching threshold deviates from the target value by more than a certain amount or that, at least during the test time period, it has deviated from the target value by more than a certain amount.

A5 On the basis of another very advantageous variant of the method according to the invention, the switching threshold is kept constant or else kept constant on the average over time, whereby the modulator has an input at which an external signal is present and, when the external signal rises, at least the test value and thus the lower limit of the tolerance range are raised so that, at the latest when the external signal has risen by more than a certain amount, the switching threshold lies below the tolerance range and thus the alarm signal is triggered. Therefore, according to this variant, whether or not the external signal has risen by the certain amount is monitored.

A6 Here, the external signal and the test value can be identical to each other. According to another variant, the test value is derived from the external signal in such a way that, when the external signal increases, the test value also increases, and when the external signal decreases, the test value also decreases.

A7 According to a variant, the switching threshold is kept constant or else kept constant on the average over time, whereby the modulator has an input at which an external signal is present and, when the external signal drops, at least the output value and thus the upper limit of the tolerance range are lowered so that, at the latest when the external signal has dropped by more than a certain amount, the switching threshold lies above the tolerance range and thus the alarm signal is triggered. Therefore, according to this variant, it is monitored whether the external signal has dropped by the certain amount or not.

A8 Here, the external signal and the output value can be identical to each other. According to another variant, the output value is derived from the external signal in such a way that, when the external signal increases, the output value also increases, and when the external signal decreases, the output value also decreases.

The limits of the tolerance range can thus accompany the external signal or its changes, whereby preferably the distance of each of the limits from the external signal remains constant; here, as soon as the change of the external signal exceeds a certain amount, the switching threshold is no longer within the tolerance range. Therefore, as a result, the external signal is monitored for drift according to the invention.

A9 According to a variant, an external signal target value is predefined for the external signal, said external signal target value being greater than the switching threshold, whereby
  either the output value, at least at a starting point in time, is equal to the external signal target value and greater than the switching threshold, and the test value, at least at the starting point in time, is smaller than the switching threshold,
  or the test value, at least at a starting point in time, is equal to the external signal target value and smaller than the switching threshold, and the output value, at least at the starting point in time, is greater than the switching threshold, so that the switching threshold, at least at the starting point in time, lies within the tolerance range, and the alarm signal is triggered when the switching threshold is no longer within the tolerance range, and thus the external signal deviates from the external signal target value by more than a predefined tolerance, or when the switching threshold, at least for the test time period has no longer been within the tolerance range and thus the external signal has deviated from the external signal target value by more than a predefined tolerance.

Preferably, the sequence of pulses of the switching output signal is fast in comparison to the speed that is to be expected or is possible for changes in the switching threshold or in the external signal. As a rule, such changes in the switching threshold or in the external signal are not desired, but the method advantageously can respond to this if such changes occur. Preferably, the number of pulses of the modulator signal and thus also the number of pulses of the switching output signal are between at least 1 pulse per minute and 100,000 pulses per second or 1,000,000 pulses per second, especially preferably between 200 and 1000 pulses per second. The test time duration can be, for example, between $10^{-5}$ seconds and 10 minutes; it is preferably between 0.01 and 0.1 seconds, especially preferably between 0.04 and 0.06 seconds. Other numerical values are, of course, also possible.

Preferably, the difference between the output value and the test value is constant over time or else constant on the average over time. According to a preferred variant of the method, the difference between the output value and the test value is kept constant over time or else kept constant on the average over time.

According to another variant, the quotient of the output value and the test value is constant over time or else it is constant on the average over time. According to a variant of the method, the quotient of the output value and the test value is kept constant over time or else it is kept constant on the average over time.

According to another preferred variant, the difference between the output value and the test value is limited to a predefined maximum value. According to a variant of the method, the difference between the output value and the test value is limited to a predefined maximum value.

The electrical signal or the external signal can be a current signal or a voltage signal.

According to a variant,
either the target value is a predefined voltage target value, the modulator signal is a positive voltage signal, the output value is a positive output voltage value that is greater than the voltage target value, and the test value is a positive test voltage value that is smaller than the target voltage value,
or the target value is a predefined negative target voltage value, the modulator signal is a negative voltage signal, the output value is a negative output voltage value that is greater than the target voltage value, and the test value is a negative test voltage value that is smaller than the target voltage value,
whereby the switching threshold is a voltage switching threshold in each case so that the switching output signal takes on the first value if the voltage of the modulator signal is greater than the voltage switching threshold, and otherwise, it takes on the second value.

According to another variant,
either the target value is a predefined positive current target value, the modulator signal is s positive current signal, the output value is a positive output current value that is greater than the current target value, and the test value is a positive test current value that is smaller than the current target value,
or the target value is a predefined negative current target value, the modulator signal is a negative current signal, the output value is a negative output current value that is greater than the current target value, and the test value is a negative test current value that is smaller than the current target value,
whereby the switching threshold is a current switching threshold in each case so that the switching output signal takes on the first value if the current of the modulator signal is greater than the current switching threshold, and otherwise, it takes on the second value.

The second value can be smaller or larger than the first value.

The switching transducer can be, for example, an optocoupler or a transistor or an electronic switch or a difference amplifier. Due to their design, all of these sub-types of a switching transducer, insofar as they are intact, require a certain minimum voltage or a certain minimum current as the input signal in order to switch through. According to an embodiment, the switching transducer is a comparator with a reference input at which a reference voltage is present in order to specify the switching threshold.

Thus, according to an embodiment, the circuit monitors the switching threshold of the comparator for deviation from the target value. Since this switching threshold is specified by the reference voltage, in this manner, the reference voltage is also monitored according to the invention with the switching threshold. The circuit is thus, at the same time, also a circuit for monitoring a voltage, here the reference voltage, for drift. Since current signals can be readily converted into voltage signals, for example, by tapping the voltage drop at a resistor caused by the current flow, the circuit can also be used to monitor a current signal for drift.

An optocoupler or a transistor or an electronic switch or a difference amplifier, for example, can be used as the switching transducer. Moreover, a comparator with, for example, a reference input at which a reference voltage can be present in order to specify the switching threshold can be used as the switching transducer.

As far as the device is concerned, the switching transducer can be, for example, an optocoupler or a transistor or an electronic switch or a difference amplifier. Moreover, the switching transducer can be, for example, a comparator with a reference input at which a reference voltage is present in order to specify the switching threshold.

According to an embodiment, the circuit has a signal source that is upstream from the modulator and, at least at times, either, in Case (i), emits a source signal to the modulator, said source signal being greater than the target value, or, Case (ii), emits a source signal to the modulator, said source signal being smaller than the target value, whereby the modulator only emits the modulator signal to the signal input of the switching transducer when said modulator receives the source signal from the signal source.

In this case, the pulsation of the switching output signal indicates that the source signal is momentarily greater than the switching threshold and, at the same time, also that the switching threshold lies between the output value and the test value.

In Case (iii), the source signal can especially be a zero signal, i.e. one whose current or voltage value is equal to zero.

The signal source can especially be a signal transmitter or a sensor that emits the following to the modulator: either, in Case (i), in the activated state, it emits the source signal that is greater than the target value, and, in the non-activated state, it emits a quiescent signal that does not exceed the target value, or, in Case (ii), in the activated state, it emits the source signal that is smaller than the target value, and, in the non-activated state, it emits a quiescent signal that does not fall below the target value. In Case (i), the quiescent signal can especially be a zero signal.

As an alternative to this, the signal source can be a signal transmitter or a sensor that emits the following to the modulator: either, in Case (i), in the non-activated state, it emits the source signal that is greater than the target value, and, in the activated state, it emits a quiescent signal that does not exceed the target value, or, in Case (ii), in the non-activated state, it emits the source signal that is smaller than the target value, and, in the activated state, it emits a quiescent signal that does not fall below the target value.

A12 According to a variant of the method, a signal source is used that is upstream from the modulator and, at least at times, either, in Case (i), emits a source signal to the modulator, said source signal being greater than the target value, or, Case (ii), emits a source signal to the modulator, said source signal being smaller than the target value, whereby the modulator signal is only emitted to the signal input of the switching transducer when said modulator receives the source signal from the signal source.

A13 As the signal source, a signal transmitter or a sensor can be used that can be in an activated or non-activated state and that emits the following to the modulator: either, in Case (i), in the activated state, it emits the source signal that is greater than the target value, and, in the non-activated state, it emits a quiescent signal that does not exceed the target value, or, in Case (ii), in the activated state, it emits the source signal that is smaller than the target value, and, in the non-activated state, it emits a quiescent signal that does not fall below the target value.

A14 As an alternative to this, as the signal source, a signal transmitter or a sensor can be used that can be in an activated or non-activated state and that emits the following to the modulator: either, in Case (i), in the non-activated state, it emits the source signal that is greater than the target value, and, in the activated state, it emits a quiescent signal that does not exceed the target value, or, in Case (ii), in the non-activated state, it emits the source signal that is smaller than the target value, and, in the activated state, it emits a quiescent signal that does not fall below the target value.

In actual practice, it is a standard procedure for the signal source to be downstream from such a switching transducer that performs a switching procedure as soon as a signal that is applied to it exceeds or falls below a switching threshold. For example, the signal source can be a sensor with a switching output and thus the source signal can be the switching signal supplied by said sensor. By means of the switching transducer, the source signal can be converted into a switching output signal that has certain predefined properties. These properties can relate, for example, to the maximum value, to the minimum value and to the time behavior of the switching output signal and can, for example, be stipulated in a standard or, for purposes of compatibility, in a so-called interface definition. The interface definition can, for example, also provide that the modulator signal has to be a current signal.

In particular, the invention can very advantageously be used to monitor the switching threshold of such an already present switching transducer. In the interface definition, it can be required, for example, that the amount of the test value has to be greater than the maximum amount of the quiescent signal. The interface definition can also specify within which value range the quiescent signal has to lie.

A signal source can be upstream from the modulator, said signal source emitting a source signal to the modulator that is equal or proportional to the output value, or else equal or proportional to the test value.

A15 A signal source can be used that is upstream from the modulator and that emits a source signal to the modulator that is equal or proportional to the output value, or that is equal or proportional to the test value.

According to an embodiment of the circuit, the modulator is capable of generating the modulator signal in that
the modulator emits the source signal either in a continuous or cyclical time sequence consecutively or alternatingly in unchanged form to the signal input of the switching transducer, so that the output value is specified by the unchanged source signal, and the modulator emits the source signal, in attenuated form to the signal input of the switching transducer, so that the test value is specified by the attenuated source signal,
or, either in a continuous or cyclical time sequence consecutively or alternatingly, the modulator emits the source signal, which has been attenuated to a first fraction, to the signal input of the switching transducer, so that the output value is specified by the source signal, which that has been reduced to the first fraction, and the modulator emits the source signal, which has been attenuated to a second fraction, to the signal input of the switching transducer, so that the test value is specified by the source signal, which has been attenuated to the second fraction, whereby the first fraction is greater than the second fraction.

A16 According to the method, the modulator signal can be generated in that
the source signal is emitted by the modulator either in a continuous or cyclical time sequence consecutively or alternatingly in unchanged form to the signal input of the switching transducer, so that the output value is specified by the unchanged source signal, and the source signal is emitted by the modulator in attenuated form to the signal input of the switching transducer, so that the test value is specified by the attenuated source signal,
or, either in a continuous or cyclical time sequence consecutively or alternatingly, the source signal, which has been attenuated to a first fraction, is emitted by the modulator to the signal input of the switching transducer, so that the output value is specified by the source signal, which has been reduced to the first fraction, and the source signal, which has been attenuated to a second fraction, is emitted by the modulator to the signal input of the switching transducer, so that the test value, which has been attenuated to the second fraction, is specified by the source signal, whereby the first fraction is greater than the second fraction.

According to an advantageous embodiment, the circuit has a voltage limiter that, at times, attenuates the source signal to the test value, thus generating the test value. According to another advantageous embodiment, the circuit has a current limiter that, at times, attenuates the source signal to the test value, thus generating the test value.

[A17] According to the method, the source signal can, at times, be attenuated to the test value by a limiter, especially by a voltage limiter or by a current limiter, thus generating the test value. The voltage limiter can be, for example, a constant voltage source. By the same token, the current limiter can be a constant current source.

The voltage limiter or the current limiter can especially be passive components or passive circuit arrangements that do not need a current or voltage supply of their own. By the same token, the voltage limiter or the current limiter can be components of circuit arrangements that are only supplied with current or voltage by the source signal and therefore, do not need supply lines of their own.

The source signal serves to supply current to the modulator so that the latter does not need separate connections for its current supply. [A18] According to the method, the modulator can be supplied with electric energy by the source signal.

According to an embodiment of the circuit, the evaluation unit is configured in such a way that it also triggers the alarm signal or that it triggers a message signal when the signal source is in the non-activated state and the switching threshold is smaller than the quiescent signal. As an alternative to this, the evaluation unit can be configured in such a way that it also triggers the alarm signal or that it triggers a message signal when the signal source is in the non-activated state and the switching threshold is greater than the quiescent signal.

[A19] According to the method, especially in Case (i), the alarm signal can also be triggered or a message signal can be triggered when the signal source is in the non-activated state and the switching threshold is smaller than the quiescent signal. According to another variant, especially in Case (ii), the alarm signal can also be triggered or a message signal can be triggered when the signal source is in the non-activated state and the switching threshold is greater than the quiescent signal.

According to a variant, when the signal source or the sensor is non-activated, the triggering of the alarm signal or of the message signal is suppressed. This can take place, for example, in that, when the signal source or the sensor is non-activated, the activity of the evaluation circuit is blocked or the alarm signal or the message signal is suppressed.

According to an alternative variant, when the signal source or the sensor is activated, the triggering of the alarm signal or of the message signal is suppressed.

The alarm signal and/or the message signal can be applied, for example, to a bus, especially in bit-encoded form or as data words, optionally in combination with an identifier, e.g. to a bus, for example, a field bus or an interface bus, and from there, said alarm signal and/or message signal can be read into other modules that are connected to the bus in order to be evaluated or forwarded. The identifier can especially indicate the signal source or the modulator or the switching transducer, for example, in order to make a distinction from other components of the same type. The signal source and/or the modulator and/or the switching transducer can be part of a slave that is connected to the bus; in this case, the identifier can indicate this slave in order to distinguish it from other slaves.

According to an embodiment of the circuit, the modulator signal is a digital signal in which the output value and the test value alternate with each other in a time sequence, whereby either the high state of the digital signal is present when the magnitude of the modulator signal is equal to the output value, and the low state of the digital signal is present when the magnitude of the modulator signal is equal to the test value, or vice versa, and a bit pattern and thus digital information are encoded in the time sequence of the output value and of the test value. Therefore, in this case, the modulator signal contains digital information, e.g. a data word having a certain number of bits. In particular, the modulator signal can be frequency-modulated for this purpose; the digital information can be impressed upon the modulator signal by frequency modulation or by varying the time sequence of the high and low states (or the pulse/pause ratio between the output value and the test value).

[A20] According to a variant of the method, as the modulator signal, the modulator generates a digital signal in which the output value and the test value alternate with each other in a time sequence, whereby either the high state of the digital signal is present when the magnitude of the modulator signal is equal to the output value, and the low state of the digital signal is present when the magnitude of the modulator signal is equal to the test value, or vice versa, and a bit pattern and thus digital information are encoded in the time sequence of the output value and of the test value. [A28] Preferably, the digital information contains an identifier that identifies the signal source.

According to a very advantageous embodiment, the circuit also has a bus that can especially be a field bus or an interface bus, as well as a master connected to it, whereby the modulator and the switching transducer are components of a slave or input slave that is likewise connected to the bus, and, at least at times, the switching output signal or the information as to whether the switching output signal is equal to the first value or to the second value, or the information as to whether the switching output signal is pulsating or not, is provided in digital form by the slave to the bus.

Preferably, the master is configured here in such a way that, via the bus, it reads and evaluates the switching output signal, or the information as to whether the switching output signal is equal to the first value or to the second value, or the information as to whether the switching output signal is pulsating or not. If the switching output signal does not pulsate for at least the predefined test time period, according to an embodiment, the master emits the alarm signal. In this case, the evaluation unit is formed by the master.

The circuit also preferably has an evaluation circuit that is likewise connected to the bus, and it reads and evaluates the switching output signal, or the information as to whether the switching output signal is equal to the first value or to the second value, or the information as to whether the switching output signal is pulsating or not. If the switching output signal does not pulsate for at least the predefined test time period, according to an embodiment, the master emits the alarm signal. In this case, the evaluation unit is formed by the evaluation circuit.

In particular, via the bus, the master and the evaluation circuit, independently of each other, can both read and evaluate the switching output signal, or the information as to whether the switching output signal is equal to the first value or to the second value, or the information as to whether the switching output signal is pulsating or not.

According to another very advantageous embodiment, the circuit also has an output slave that is likewise connected to the bus, and, in the case where the switching output signal not pulsate for at least the predefined test time period, the master or the evaluation circuit sends a control command to the output slave which causes the latter to emit the alarm signal. In this case, the evaluation unit is formed by the output slave together with the master or the evaluation circuit.

According to another embodiment, the slave or input slave provides digital message information to the bus when the signal source is in the non-activated state and the switching threshold is smaller than the quiescent signal, whereby the message information triggers the alarm signal or the message signal.

According to another embodiment, the slave provides digital message information to the bus when the signal source is in the non-activated state and the switching threshold is greater than the quiescent signal, whereby the message information triggers the alarm signal or the message signal.

According to the method, a bus, especially a field bus or an interface bus, as well as a master connected to it can be used, whereby the modulator and the switching transducer are components of a slave or input slave that is likewise connected to the bus, and, at least at times, the switching output signal or the information as to whether the switching output signal is equal to the first value or to the second value, or the information as to whether the switching output signal is pulsating or not, is provided in digital form by the slave to the bus.

Here, for example, by means of the master, the switching output signal or the information as to whether the switching output signal is equal to the first value or to the second value, or the information as to whether the switching output signal is pulsating or not, can be read and evaluated via the bus.

Furthermore, an evaluation circuit can be used that is likewise connected to the bus and by means of which the switching output signal, or the information as to whether the switching output signal is equal to the first value or to the second value, or the information as to whether the switching output signal is pulsating or not, is read and evaluated via the bus.

According to another variant, an output slave is used that is likewise connected to the bus, whereby, if the switching output signal does not pulsate for at least the predefined test time period, the master or the evaluation circuit sends, via the bus, a control command to the output slave by means of which said output slave is prompted to emit the alarm signal.

According to a variant, especially in Case (i), the slave or the input slave provides digital message information to the bus when the signal source is in the non-activated state and the switching threshold is smaller than the quiescent signal, and the alarm signal or the message signal is triggered by means of the message information.

According to another variant, especially in Case (ii), the slave or the input slave provides digital message information to the bus when the signal source is in the non-activated state and the switching threshold is greater than the quiescent signal, and the alarm signal or the message signal is triggered by means of the message information.

The switching transducer can be connected to the ground via an offset voltage source, whereby the offset voltage source emits an offset voltage and, as a result, the switching threshold of the switching transducer is shifted by the amount of the offset voltage.

The circuit can contain or comprise an additional circuit, especially for the purpose of using the additional circuit to monitor internal signals for drift. The circuit can monitor itself. In particular, the circuit can additionally comprise a circuit that is capable of monitoring the offset voltage for drift.

According to the method, the switching transducer can be connected to the ground via an offset voltage source, whereby the offset voltage source emits an offset voltage and, as a result, the switching threshold of the switching transducer is shifted by the amount of the offset voltage. The offset voltage (or another circuit-internal signal) can especially, in turn, be monitored by the method according to the invention. The electric signal or the external signal can especially be the offset voltage.

The invention makes it possible to meet the requirement of safety standards that call for the safety-oriented determination of switching thresholds and can thus ensure the compatibility between safety-oriented switching devices.

DETAILED DESCRIPTION OF THE PREFERRED EMBODIMENTS

Figure 1:
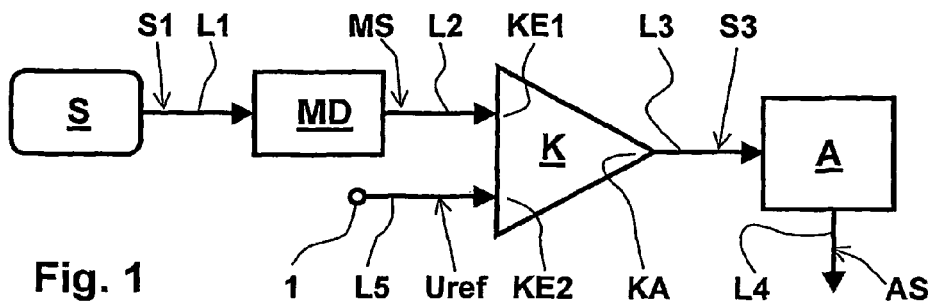
FIG. 1—a block diagram of an embodiment of a circuit that operates on the basis of the method according to the invention, comprising a sensor, a modulator, a comparator and an evaluation unit.

First of all, reference will be made to FIGS. 1 to 5. FIG. 1 shows a block diagram of a circuit for executing the method according to the invention. The circuit shown in FIG. 1 serves for the inventive monitoring of the switching threshold of a comparator K for deviation from a target value, said circuit also comprising a signal source S, an evaluation unit A and a modulator MD. The comparator K has a signal input KE1, a reference input KE2 and a switching output KA.

In principle, any direct-voltage source, for instance, a battery or an in-phase regulator, can serve as the signal source S. In the example shown in FIG. 1, the signal source S is a sensor S that can be in an activated and in a non-activated state.

The sensor S can especially be one with a switching output, particularly a proximity sensor that responds when an object approaches and, in this process, changes over from the non-activated state to the activated state. According to another example, the sensor S is a temperature sensor with a switching output and it changes over to the activated state when the temperature exceeds a limit value and returns to the non-activated state once the temperature once again falls below the limit value.

Via a line L1, the sensor S emits a voltage signal S1 as the source signal S1 to the modulator MD, said voltage signal S1 being a preferably constant direct voltage of the magnitude U1 when the sensor S is in the activated state and being a preferably constant quiescent voltage signal $U_{quiescent}$ when the sensor S is in the non-activated state, whereby said quiescent voltage signal $U_{quiescent}$ is preferably not a zero signal. Therefore, the source signal S1 equals either U1 or $U_{quiescent}$, depending on whether the sensor S is activated or not.

Figure 2:
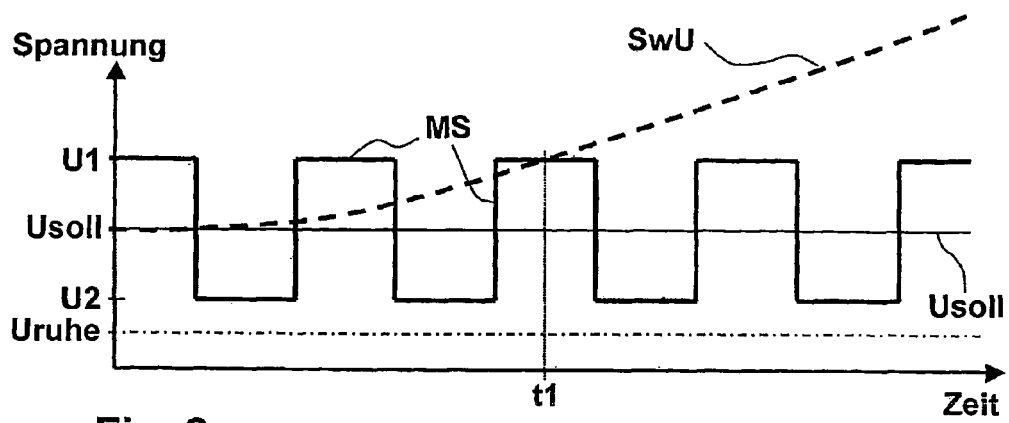
FIG. 2—in each case, an example of the time characteristic of the modulator voltage that the modulator of FIG. 1 provides to the comparator when the sensor is activated, as well as an example of the time characteristic of a threshold voltage exhibiting a strong drift.

Then, when the sensor S emits the output voltage signal U1 and is thus in the activated state, the modulator MD emits a modulator signal MS to the signal input KE1 of the comparator via the line L2, said modulator signal alternating continuously or cyclically between the unchanged output value U1 and a test value U2. Therefore, in this example, the modulator signal MS is a voltage signal and pulsates between the values U1 and U2. The time characteristic of the modulator signal MS is depicted in FIG. 2 as a square-wave curve.

According to a preferred embodiment of the invention, when the sensor S is activated, the modulator MD generates the modulator signal MS in that continuously alternatingly consecutively, it emits the source signal S1 in unchanged form to the signal input KE1 of the comparator K, so that the output value U1 is specified by the unchanged source signal S1, and, for example, by means of a voltage divider, it emits the source signal S1 in attenuated form to the signal input KE1 of the comparator K, so that the test value U2 is specified by the attenuated source signal S1.

In particular, the source signal S1 can also concurrently serve to supply current to the modulator MD, so that the modulator does not need a separate connection to a current supply and can thus be installed with very little effort.

Via its switching output KA and a line L3, the comparator K emits a switching output signal S3 to the evaluation unit A, said switching output signal taking on a first value W1 if the voltage of the modulator signal MS is greater than the switching threshold SwU, and otherwise, taking on a second value W2.

Figure 3:
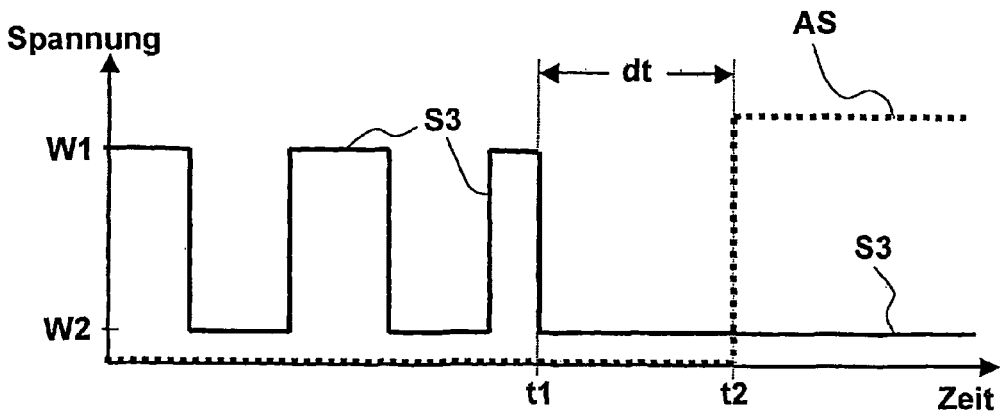
FIG. 3—in each case, an example of the time characteristic of the switching output voltage that the comparator shown in FIG. 1 provides to the evaluation unit when the sensor is activated, as well as an example of the time characteristic of the alarm signal emitted by the evaluation unit, whereby the time axis shown in FIG. 3 matches that of FIG. 2.

FIG. 3 shows the switching output signal S3 that results from the time characteristics of the modulator signal MS and of the switching threshold SwU.

In the present example, the switching threshold SwU should be specified by a constant target value $U_{target}$. In order to specify this switching threshold $SwU=U_{target}$, a reference voltage $U_{ref}$ (FIG. 1) that should be equal to the target value $U_{target}$ is applied to the reference input KE2 of the comparator K via a terminal 1. In this manner, the condition $SwU=U_{ref}=U_{target}$ should be met.

As long as this condition is met, when the sensor S is activated, the switching output signal S3 pulsates synchronously with the modulator signal MS between the values W1 and W2. The pulsation of the switching output signal S3 indicates that the sensor S is activated and that the switching threshold SwU lies between U1 and U2.

In actual practice, however, the switching threshold SwU can experience a drift due to temperature fluctuations, ageing, wear and tear, defects or other undesired influences; an example is shown in FIG. 2 as a curve indicated by a broken line that depicts the time characteristic of a switching threshold SwU that is drifting upwards. This can also be caused by drifting of the reference voltage $U_{ref}$ or else because the switching threshold SwU rises due to a drift inside the comparator K, even though the reference voltage $U_{ref}$ remains constant at the target value $U_{target}$ so that SwU=$U_{ref}$ no longer applies.

At a point in time t1, the switching threshold SwU exceeds the value U1 (FIG. 2), with the result that the switching output signal S3 drops to the value W2 at the point in time t1 and remains at that value, in other words, is no longer pulsating (FIG. 3).

The evaluation unit A monitors the switching output signal S3 for pulsation and emits an alarm signal AS (curve indicated by a dotted line in FIG. 3) via a line L4 when the switching output signal S3 does not pulsate for at least a specified test time period dt that is longer than the maximum duration of the pulses of the switching output signal S3. Therefore, the point in time for triggering the alarm signal AS is t2=t1+dt in the present example. The upward drift of the switching threshold SwU was thus ascertained by means of the invention.

Figure 4:
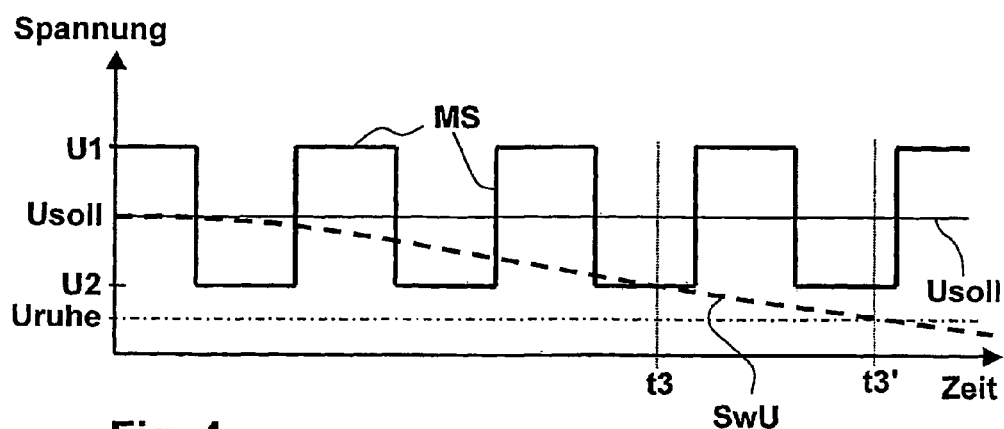
FIG. 4—in each case, another example of the time characteristic of the modulator voltage as well as an example of the time characteristic of a threshold voltage exhibiting a strong drift.
Figure 5:
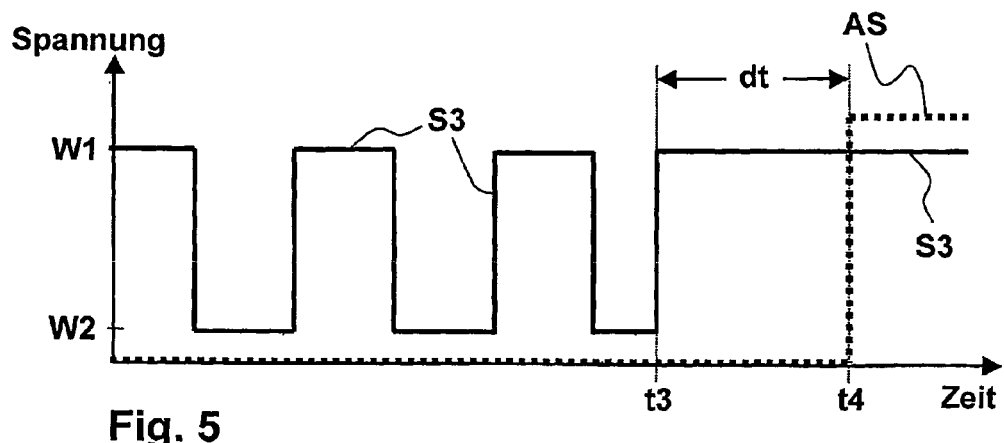
FIG. 5—in each case, an example of the time characteristic of the switching output voltage as well as an example of the time characteristic of the alarm signal emitted by the evaluation unit, whereby the time axis shown in FIG. 5 matches that of FIG. 4.

An example of the time characteristic of a switching threshold SwU that is drifting downwards is shown FIG. 4. At a point in time t3, the switching threshold SwU falls below the value U2 (FIG. 4), with the result that the switching output signal S3 rises to the value W1 at the point in time t3 and remains at that value, in other words, it no longer pulsates (FIG. 5), as a result of which the alarm signal AS (curve indicated by a dotted line in FIG. 5) is triggered by the evaluation unit A at a point in time t4=t3+dt. Therefore, the downward drift of the switching threshold SwU was also ascertained by means of the invention.

The output value U1 and the test value U2 thus constitute the limits of a predefined tolerance range for the switching threshold of the comparator K. If the switching threshold lies outside of the tolerance range, the alarm signal AS is triggered. Thus, the alarm signal AS indicates that the switching threshold lies outside of the tolerance range (or was outside of the tolerance range at least during the test time period) and therefore deviates from the target value $U_{target}$ by more than a certain amount. Consequently, the method according to the invention serves here to monitor the switching threshold for deviation from the target value $U_{target}$.

In FIG. 4, the switching threshold SwU also falls below the quiescent value $U_{quiescent}$ at a point in time t3'. According to a very advantageous embodiment of the invention, the evaluation unit A also triggers the alarm signal AS when the sensor S is in the non-activated state and the switching threshold SwU is smaller than the quiescent signal $U_{quiescent}$. In the case shown in FIG. 4, the alarm signal AS in this embodiment is thus triggered at the point in time t4 when the sensor S is activated, and at the point in time t3' when the sensor S is not activated. An essential advantage of this embodiment is thus the fact that the drift of the switching threshold SwU is detected even when the sensor S is not activated.

The output value U1 and the test value U2 preferably both have the same sign as the target value $U_{target}$. The output value U1 is greater than the target value $U_{target}$. The test value U2 is smaller than the target value $U_{target}$ but greater than the quiescent value $U_{quiescent}$. Preferably, the modulator MD generates the test value U2 internally by attenuating the output signal U1, for instance, by means of a voltage divider. The quiescent signal $U_{quiescent}$ likewise has the same sign as the target value $U_{target}$ but the former is smaller than the latter.

The values of the voltages U1 and W1 are each preferably within the range between 3 volts and 10 volts; the values of the voltages U2 and W2 are each preferably within the range between 0 volt and 3 volts. For instance, at a target value $U_{target}$=4 volts, it can be the case that U1=5 volts, U2=3 volts and $U_{quiescent}$=1 volt, or else at a target value $U_{target}$=−4 volts, it can be the case that U1=−5 volts, U2=−3 volts and $U_{quiescent}$=−1 volt.

Therefore, in the example shown in FIGS. 1 to 5, the target value is a predefined voltage target value $U_{target}$, the modulator signal is a pulsating voltage signal MS, the output value is an output voltage value U1, the test value is a voltage test value U2, and the switching threshold of the comparator K is a voltage switching threshold SwU.

Figure 6:
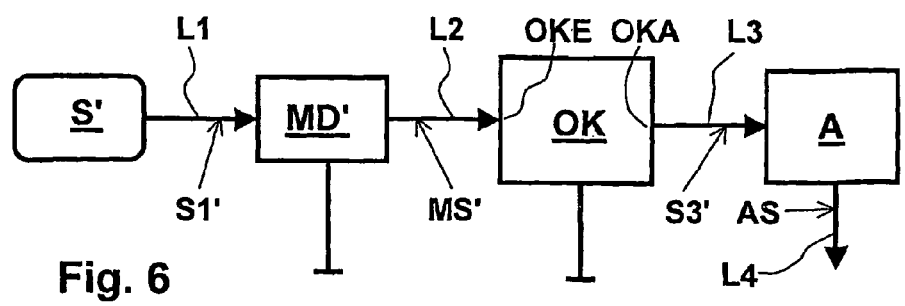
FIG. 6—a block diagram of another embodiment of a circuit that operates on the basis of the method according to the invention, comprising a sensor, a modulator, an optocoupler and an evaluation unit.

Now reference will be made to FIGS. 6 to 10. FIG. 6 shows a block diagram of an embodiment of a circuit for the inventive monitoring of the switching threshold of an optocoupler OK for deviation from a target value, comprising a signal source S', a modulator MD' and the evaluation unit A.

In contrast to the comparator K shown in FIG. 1, the optocoupler K does not switch as a function of the voltage, but rather as a function of the current, that is to say, the optocoupler K switches when, at its signal input OKE, it receives a current signal that is greater than a current switching threshold SwI.

The signal source S' is a direct-current source that, as the output current signal, emits a direct current that has the same sign as the target value but the former is greater than the latter. In the example in FIG. 6, the signal source S' is a sensor S' that can be in an activated and in a non-activated state.

Via the line L1, the sensor S' emits a current signal S1' as a source signal to the modulator MD', said current signal S1' being a preferably constant direct current of the magnitude I1 when the sensor S' is in the activated state and being a preferably constant quiescent current signal $I_{quiescent}$ when the sensor S' is in the non-activated state, whereby said quiescent current signal is preferably not a zero signal. Therefore, the source signal S1 equals either I1 or $I_{quiescent}$, depending on whether the sensor S' is activated or not.

Figure 7:
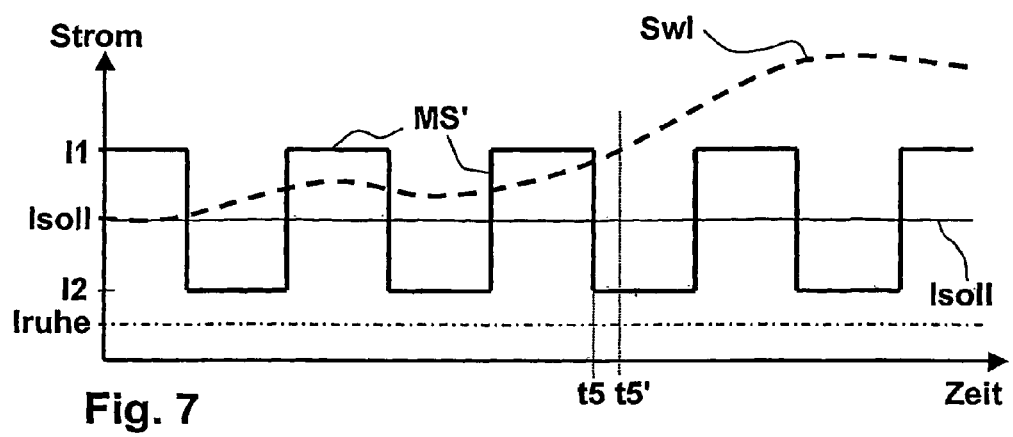
FIG. 7—an example of the time characteristic of the modulator current that the modulator shown in FIG. 6 provides to the optocoupler when the sensor is activated, as well as an example of the time characteristic of a threshold current exhibiting a strong drift.

Then, when the sensor S' emits the output current signal I1 and is thus in the activated state, the modulator MD' emits a modulator signal MS' to the signal input OKE of the comparator via the line L2, said modulator signal alternating between the unchanged output value I1 and a test value I2. Therefore, in this example, the modulator signal MS' is a current signal and pulsates between the values I1 and I2. The time characteristic of the modulator signal MS' is depicted in FIG. 7 as a square-wave curve.

According to a preferred embodiment of the invention (in this context, see FIG. 16, which will be elaborated upon below), the modulator MD' generates the modulator signal MS' in that continuously alternatingly consecutively, it emits the source signal S1' in unchanged form to the signal input OKE of the optocoupler OK, so that the output value I1 is specified by the unchanged current signal S1', and, for example, by means of a current limiter, it emits the source signal S1' in attenuated form to the signal input OKE, so that the test value I2 is specified by the attenuated source signal S1' in terms of current.

In particular, the source signal S1' can also concurrently serve to supply current to the modulator MD', so that the modulator does not need a separate connection to a current supply and can thus be installed with very little effort.

Via its switching output OKA and a line L3, the optocoupler OK emits a switching output signal S3' to the evaluation unit A, said switching output signal taking on a first value W1 if the current of the modulator signal MS' is greater than the switching threshold SwI, and otherwise, taking on a second value W2.

Figure 8:
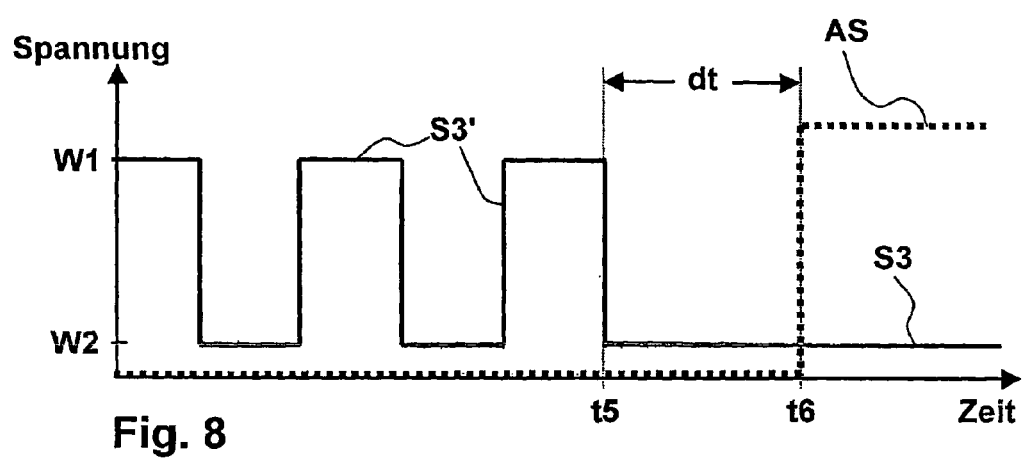
FIG. 8—an example of the time characteristic of the switching output voltage that the optocoupler shown in FIG. 6 provides to the evaluation unit when the sensor is activated, as well as an example of the time characteristic of the alarm signal emitted by the evaluation unit, whereby the time axis shown in FIG. 8 matches that of FIG. 7.

FIG. 8 shows the switching output signal S3' that results from the time characteristics of the modulator signal MS' and of the switching threshold SwI shown in FIG. 7.

In the example that was explained making reference to FIGS. 6 to 10, the switching threshold SwI should be specified by a constant current target value $I_{target}$. As long as this condition is met, the switching output signal S3' pulsates synchronously with the modulator signal MS' between the values W1 and W2. The pulsation of the switching output signal S3' indicates that the current switching threshold SwI lies between I1 and I2.

In actual practice, however, an undesired drift of the current switching threshold SwI can occur, so that SwI=$I_{target}$ no longer applies; an example is shown as a curve indicated by a broken in FIG. 7. At a point in time t5', the switching threshold SwI exceeds the value I1 (FIG. 7), with the result that the switching output signal S3'—which has already dropped to the value W2 at the point in time t5 within the scope of its pulsation between the values W1 and W2, which is still at the value W2 at the point in time t5'—remains at that value, in other words, is no longer pulsating after the point in time t5.

The evaluation unit A monitors the switching output signal S3' for pulsation and emits an alarm signal AS (curve indicated by a dotted line in FIG. 8) via a line L4 when the switching output signal S3' does not pulsate for at least a predefined test time period dt that is longer than the maximum pulse duration of the switching output signal S3'. Therefore, the point in time for triggering the alarm signal AS is t6=t5+dt in the present example. The upward drift of the switching threshold SwI shown in FIG. 7 was thus ascertained by means of the invention.

Figure 9:
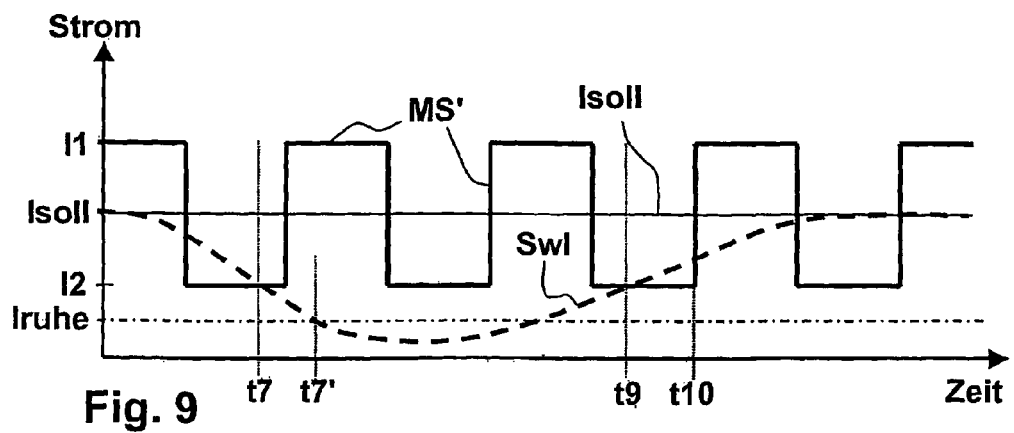
FIG. 9—another example of the time characteristic of the modulator current as well as an example of the time characteristic of a threshold current exhibiting a strong drift.

Another example of the time characteristic of a drifting current switching threshold SwI is shown in FIG. 9. At a point in time t7, the switching threshold SwI falls below the test value I2 (FIG. 9), with the result that the switching output signal S3' rises to the value W1 at the point in time t7 and remains at that value, in other words, it no longer pulsates (FIG. 10), as a result of which the alarm signal AS (curve indicated by a dotted line in FIG. 10) is triggered by the evaluation unit A at a point in time t8=t7+dt.

In FIG. 9, the switching threshold SwI at a point in time t7' also falls below the quiescent value $I_{quiescent}$. According to a very advantageous embodiment of the invention, the evaluation unit A triggers the alarm signal AS even when the sensor S' is in the non-activated state and the current switching threshold SwI is smaller than the quiescent signal $I_{quiescent}$. In the case shown in FIG. 9, the alarm signal AS in this embodiment is thus triggered at the point in time t8 when the sensor S is activated, and at the point in time t7' when the sensor S' is not activated. An essential advantage of this embodiment is thus the fact that the drift of the switching threshold SwU is detected even when the sensor S' is not activated.

Figure 10:
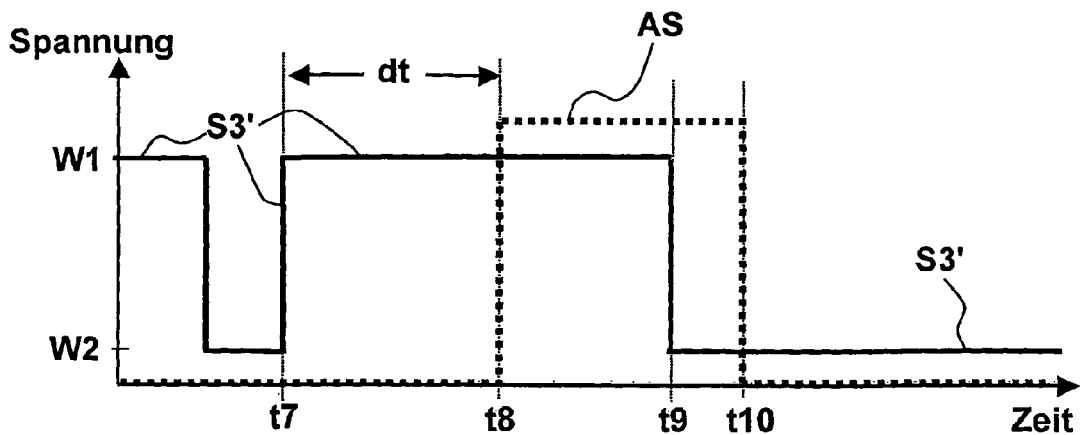
FIG. 10—another example of the time characteristic of the switching output voltage that the optocoupler shown in FIG. 6 emits to the evaluation unit when the sensor is activated, as well as an example of the time characteristic of the alarm signal emitted by the evaluation unit, whereby the time axis shown in FIG. 10 matches that of FIG. 9.

In the example shown in FIG. 9, the switching threshold SwI once again exceeds the test value I2 at a point in time t9, with the result that the switching output signal S3' starts to pulsate once again during the next transition of the modulator signal MS' from the test value I2 to the output value I1; this point in time is designated by t10 in FIGS. 9 and 10. According to a variant of the invention, the alarm signal AS is therefore terminated or reset at the point in time t10, as is depicted in FIG. 10.

The output value I1 and the test value I2 preferably both have the same sign as the target value $I_{target}$. The output value I1 is greater than the target value $I_{target}$. The test value I2 is smaller than the target value $I_{target}$ but greater than the quiescent value $I_{quiescent}$. Preferably, the modulator MD' generates the test value I2 internally by attenuating the output signal I1, for instance, by means of a current limiter. The quiescent signal $I_{quiescent}$ likewise has the same sign as the target value $I_{target}$ but the former is smaller than the latter.

For instance, at a target value $I_{target}$=12 mA, it can be the case that the value I1=20 mA, the value I2=4 mA and the value $I_{quiescent}$=2 mA, or else at a target value $I_{target}$=−12 mA, it can be the case that the value I1=−20 mA, the value I2=−4 mA and the value $I_{quiescent}$=−2 mA.

Therefore, in the example shown in FIGS. 6 to 10, the target value is a predefined current target value $I_{target}$, the modulator signal is a pulsating current signal MS' pulsating between I1 and I2, the output value is an output current value I1, the test value is a current test value I2, and the switching threshold of the optocoupler OK is a current switching threshold SwI.

In the examples that are explained making reference to FIGS. 1 to 10, the switching output signals S3, S3' are voltage signals that can each take on the voltage values W1 or W2. According to alternative variants, the switching output signals S3, S3' can be current signals that can each take on two different current values whereby, in particular, one of these current values can be equal to zero.

Figure 11:
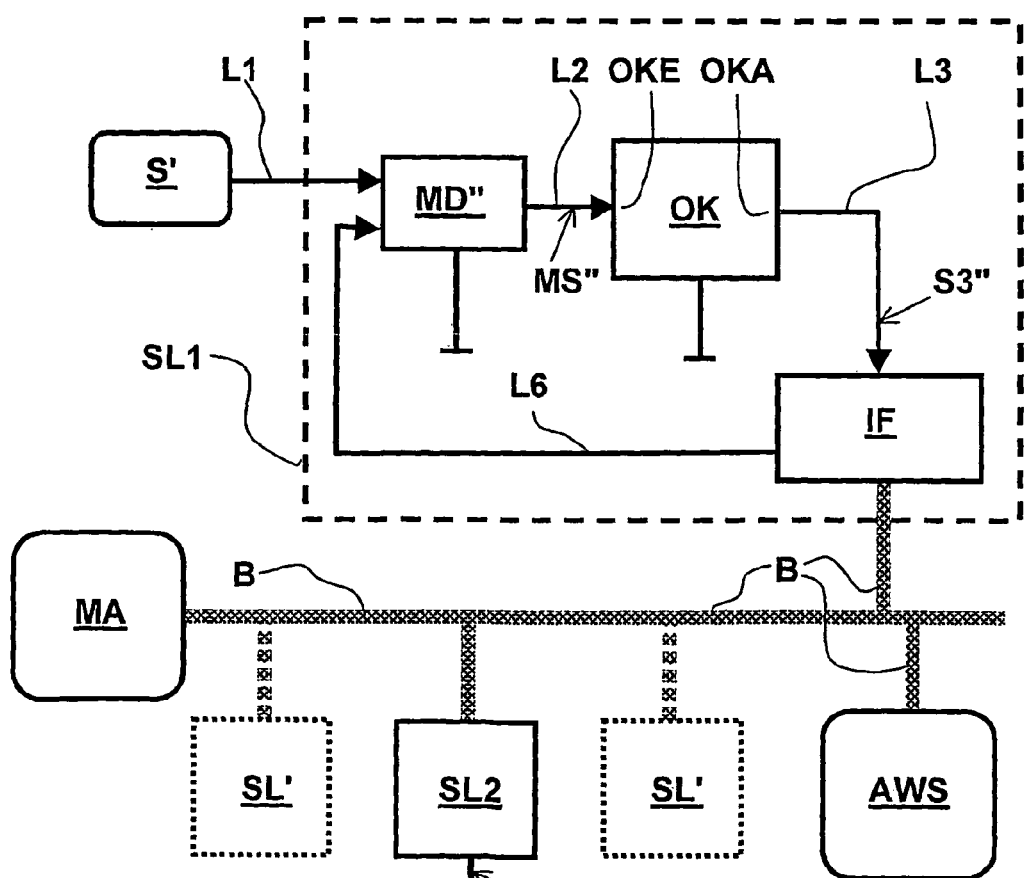
FIG. 11—a block diagram of another embodiment of a circuit that operates on the basis of the method according to the invention, comprising a bus to which a master, an evaluation unit and at least two slaves are connected, one of which contains the modulator and the comparator shown in FIG. 1.

Reference will now be made to FIG. 11, which, as an example of another embodiment of a circuit for executing the method according to the invention, in the form of a block diagram, schematically shows a field bus or an interface bus system having a bus B to which a master MA, an input slave SL1, an output slave SL2 and an evaluation circuit AWS are connected. The sensor S' is connected to the input slave SL1.

The slave SL comprises a modulator MD", the optocoupler shown in FIG. 6 as well as an interface IF.

Additional slaves SL' can be connected to the bus B for further functions; these are immaterial for the present embodiment and have therefore been depicted with a broken line.

Via the line L1, the sensor S' emits the current signal S1' to the modulator MD", said current signal having already been explained in reference to FIGS. 6 to 10 and being equal to either $I_1$ or $I_{quiescent}$, depending on whether the sensor S' is activated or not.

The modulator MD" shown in FIG. 11 differs from the modulator MD' shown in FIG. 6 in that the modulator MD" has an additional input to which a line L6 is connected, and in that, when the sensor S' is activated, the modulator MD" emits a digital modulator signal MS" containing digital information to the signal input OKE of the optocoupler OK. The digital modulator signal can be a voltage signal but it is preferably a current signal.

When the sensor S' emits the output current signal I1 and is thus in the activated state, the modulator MD" then emits the modulator signal MS" to the signal input OKE of the optocoupler OK via the line L2, said modulator signal alternating between the unchanged output value I1 and the test value I2. Therefore, the current signal MS" emitted by the modulator MD" pulsates between the values I1 and I2.

The line 6 connects the interface IF with the modulator MD".

Via its switching output OKA and the line L3, the optocoupler OK emits a switching output signal S3" to the interface IF. The switching output signal S3" takes on the first value W1 if the current signal MS" emitted by the modulator MD" is greater than the switching threshold SwI, and otherwise, it takes on the second value W2.

When the sensor S' is activated, the current signal MS" emitted by the modulator MD", as already mentioned, is a digital signal in which the output value I1 and the test value I2 alternate with each other in a time sequence, whereby, in the time sequence of the output value I1 and of test value I2, a bit pattern and thus digital information (e.g. a data word or a certain bit sequence) is encoded which identifies, for instance, the sensor S' or else said digital information contains another identifier and/or, for example, measured data, that is to say, the pulses of the signal MS" vary in length.

As long as the switching threshold SwI of the optocoupler OK is between I1 and I2, the switching threshold signal S3" pulsates synchronously with the signal MS" emitted by the modulator MD", that is to say, the switching output signal S3" also contains the digital information in the case of the circuit arrangement shown in FIG. 11. Therefore, this information is transmitted together with the switching output signal S3" to the interface IF via the line L3.

The master MA communicates cyclically consecutively at least unidirectionally with all of the slaves that are connected to the bus B and thus once per cycle with the interface IF as well. Once per cycle, the interface IF transmits the above-mentioned digital information that it has received, via the line L3, to the bus B. The content of the digital information transmitted in this manner from the interface IF to the bus B can vary from cycle to cycle. In particular, the digital information can contain the information as to whether the switching output signal S3" is pulsating or not, Preferably, in addition to the information as to whether the switching output signal S3' is pulsating or not, the digital information also contains a digital identifier of the sensor S' or of the slave SL1 that identifies the sensor S' or the slave SL1. The interface IF synchronizes the operation of the modulator MD" with the bus cycles via the line L6. The interface IF can be, for instance, a microprocessor.

According to a variant, via the bus B (preferably once in each cycle), the master MA reads in the information as to whether the switching output signal S3" is pulsating or not, evaluates this information and causes the alarm signal AS to be emitted if the switching output signal S3" does not pulsate for at least the test time period dt. In this variant, the evaluation circuit AWS shown in FIG. 11 is not needed and can be dispensed with; in this variant, its function is taken over by the master MA.

According to another variant, via the bus B (preferably once in each cycle), the evaluation circuit AWS reads in the information as to whether the switching output signal S3" is pulsating or not, evaluates this information and causes the alarm signal AS to be emitted if the switching output signal S3" does not pulsate for at least the test time period dt (which in this variant of the method is longer than the maximum pulse duration of the modulator signal MS"). Therefore, via the bus B and preferably in each cycle, the master MA or the evaluation circuit AWS reads in the digital information stemming from the slave SL1 and thus acquires information as to whether the switching threshold SwI lies between the values I1 and I2 or not.

The circuit shown in FIG. 11 also has an output slave SL2 that is likewise connected to the bus B, whereby, if the switching output signal S3' does not pulsate for at least the pre-defined test time period dt, the master MA or the evaluation circuit AWS sends a control command to the output slave SL2 via the bus B which then causes it to emit the alarm signal AS, that is to say, the master MA or the evaluation circuit AWS causes the alarm signal AS to be emitted if the switching output signal S3" does not pulsate for at least the test time period dt, preferably by sending an appropriate control command to the output slave SL2 via the bus B.

Of course, the approach that is explained making reference to FIG. 11 is completely possible using voltage signals instead of the above-mentioned current signals.

Figure 16:
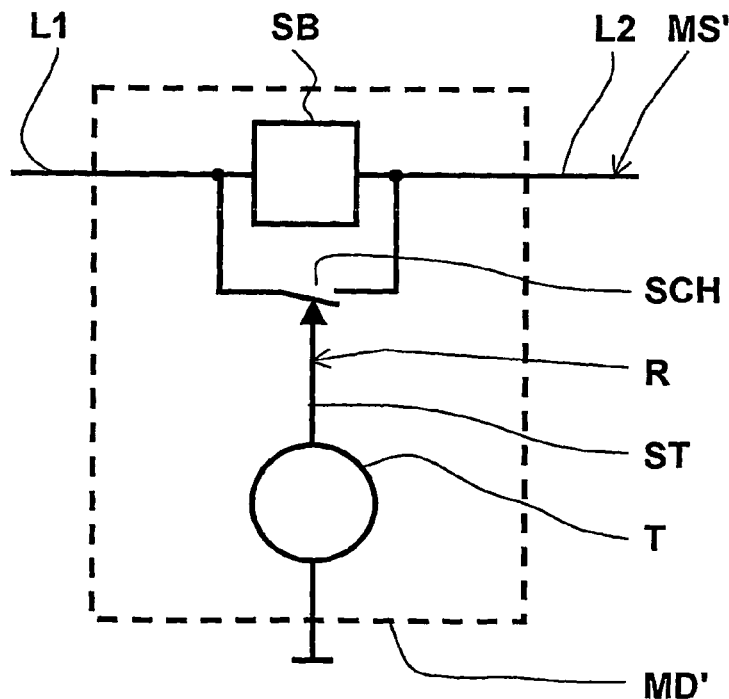
FIG. 16—a conceivable embodiment of the modulators shown in FIGS. 6, 12 and 15 as well as a principle circuit diagram.

FIG. 16 shows one of many conceivable embodiments of the modulator MD' shown in FIG. 6 as a principle circuit diagram that is connected to the signal source or to the sensor S1' via the line L1, and to the optocoupler OK via the line L2, as depicted in FIG. 6.

According to the embodiment shown in FIG. 16, the lines L1 and L2 are connected to each other via a current limiter SB. A controllable switch SCH is connected in parallel to the current limiter SB, so that, in the closed state, this switch bridges the current limiter SB.

The controllable switch SCH is controlled by the synchronizing pulse generator T via a control line ST with a square-wave signal R in such a way that the switch continuously opens and closes alternatingly.

When the switch SCH is closed, the source signal S1', which is preferably a current signal, reaches the line L2 in unchanged form. Therefore, when the sensor S' is activated and the switch SCH is closed, the current signal I1 reaches the signal input OKE of the optocoupler OK (see FIGS. 6 and 7).

In contrast, when the sensor S' is activated and the switch SCH is open, the current signal S1' is attenuated to the value I2 (see FIG. 7) by the current limiter SB. Consequently, the value I2 is generated by the attenuation of the source signal S1'. The current signal MS' (FIG. 7) reaching the optocoupler OK via the line L2 thus pulsates between the values I1 and I2, provided that the sensor S' is activated.

Figure 14:
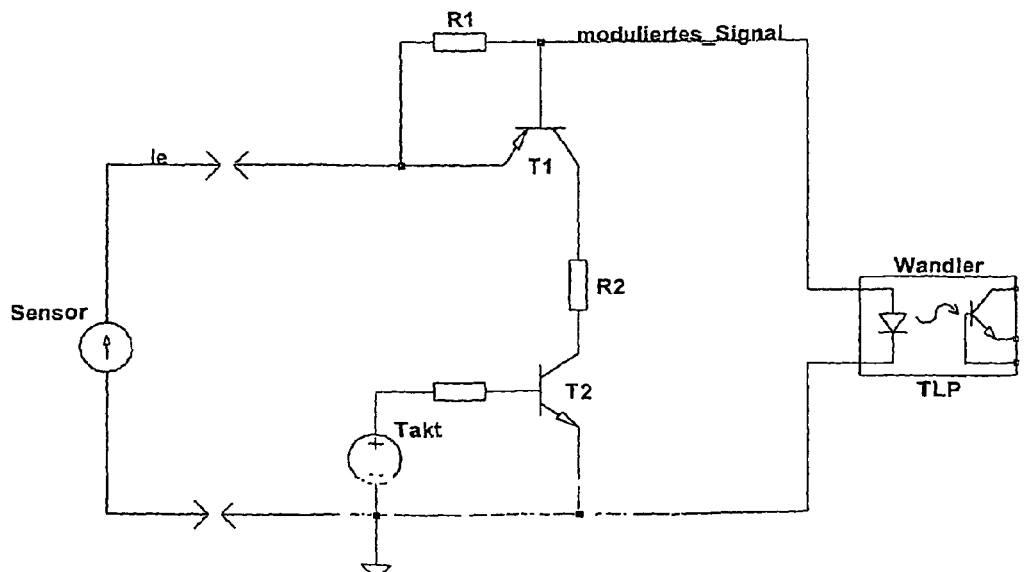
FIG. 14—a circuit diagram as an example of an implementation of the modulator that consists of individual components and that is connected to the sensor and to the transformer.

The modulator MD' shown in FIG. 16 can consist, for instance, of individual components as depicted in FIG. 14. The modulators of the circuits shown in FIGS. 12 and 15 can each consist of the modulator MD' shown in FIG. 16.

The switching transducer will be referred to below as transformer.

The invention relates to the reliable monitoring of current and voltage switching thresholds of components that exhibit drift.

1) Background:

The switching techniques described here are employed in the realm of functional safety for purposes of providing protection for people and machinery.

Devices that carry out safety-oriented functions can consist of electromechanical components (switches, relays) as well as of electronic components.

Safety devices from this sector are characterized in that they execute safety functions with a high level of reliability. Such safety devices are required to perform in such a way that the execution of the safety functions is not compromised even when partial components are defective. Examples of defects of components are short-circuits, interruptions and drift of electric parameters.

Usual methods that serve to maintain the safety function when component defects occur are:

the redundancy of components: several components fulfill the same safety function. In this context, each component has to be able to perform the safety function on its own, even when the other redundant components are defective. Circuits with redundancy fail more easily in the case of drift brought about by a common cause (e.g. temperature). Redundant channels that jointly monitor a switching signal are not easy to uncouple electrically. As a result, the redundant channels are no longer completely independent; the number of errors having a common cause in the overall system rises and increases the dangerous risk of failure.

error detection through diagnosis: the proper functioning of a component is monitored by an added diagnosis component. If the diagnosis detects a safety-relevant component error, it reports the error or preventively carries out the safety function via an independent mechanism of action.

2) Special Problems Encountered with Electronic Components:

Short-circuits and interruptions are errors that tend to affect all electric components across the board.

When it comes to electronic components, depending on the application, the drift of electric parameters takes center stage. These errors are more difficult to detect and to control than short-circuits or interruptions.

Controlling or detecting the drift of electric parameters in components is important:
- in the determination of safety-oriented analog signals having a continuous value range, or
- in the evaluation of digital signals having safety-oriented switching thresholds.

3) Area of Application of the Invention:

The invention achieves the objective of detecting the drift of switching thresholds in components that serve to evaluate safety-oriented digital signals. The inventions can be employed for digital signals whose states are defined by means of voltage and/or current ranges. Examples of this are switching signals according to IEC 61131-2 type 2, according to a familiar definition of sensor switching signals, digital IO modules and controls which are supposed to ensure the compatibility of the modules produced by different manufacturers.

To a growing extent, even in the realm of safety technology, not only are electric signals considered from a purely digital standpoint, but also the limit values of the switching thresholds are laid down in a safety-oriented manner as set forth in the standard IEC 61131-2 type 2. An example of this trend is the stipulation of the switching thresholds in the safety standard IEC 61496-1:2004 for protection devices that operate contact-free.

4) Reliable Drift Detection of the Current Switching Threshold:

The arrangement described below is characterized by the following capabilities:
- Safety-oriented evaluation of a current switching signal with reliable detection of the drift of the current switching threshold within a defined tolerance range.
- Conversion of a static safe input current signal into a drift-impervious dynamic output signal.
- In the case of an active (current-carrying) input signal, the drift can be detected without changing the state of the input signal.
- The safety-oriented signal paths can be supplied completely from the signal current. This prevents hazardous leakage currents from external sources of current that could lead to a falsification of the safety signal.
- The arrangement can be combined with the arrangement described below pertaining to a reliable drift detection of a voltage switching threshold.

4.1) Principle of the Signal Evaluation:

The arrangement is conceived as a current-drawing digital input.

The objective of the arrangement is to convert a static, safe input current signal into a drift-impervious dynamic output signal. In this context, the switching state of the output signal is not defined by means of the voltage or current level but rather, by means of a frequency modulation in order to implement fault detection (diagnosis). The following signal arrangement applies:

TABLE 1

Signal allocation.

| Input | Output |
| --- | --- |
| static low level | static output signal |
| static high level | dynamic output signal |

For purposes of converting the signal, a dynamic timing signal is modulated onto the static input current.

Figure 12:
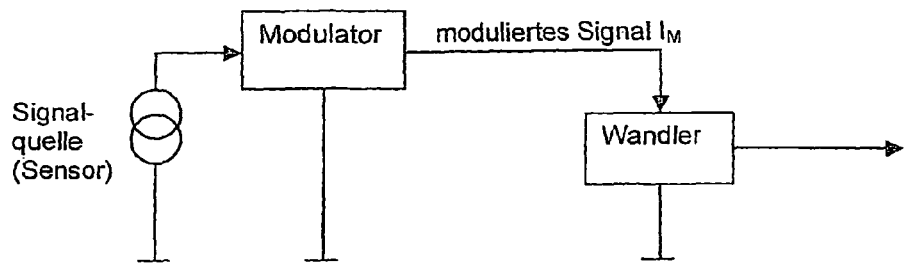
FIG. 12—a block diagram of another embodiment of a circuit that operates on the basis of the method according to the invention, comprising a signal source, a modulator and a transformer.
Figure 13:
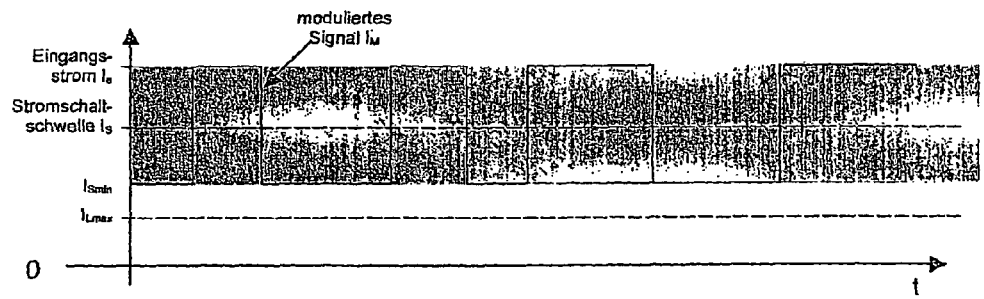
FIG. 13—an example of a signal modulation.

FIG. 12 shows a block diagram of an embodiment of a circuit for executing the method according to the invention. FIG. 13 shows an example of a signal modulation.

The upper limit of the modulated current signal $I_M$ results from the static input current $I_e$. The lower limit or the direct-current offset $I_{Smin}$ of the modulated current signal $I_M$ marks the lower limit of the tolerance range within which the current switching threshold of the transformer is allowed to move. Therefore, the direct-current offset $I_{Smin}$ is dimensioned in such a way that it either equals or exceeds the safety-oriented requisite maximum current for the switch-off state $I_{Lmax}$. The direct-current offset $I_{Smin}$ displays the behavior of a constant current. As long as the input current does not exceed this lower limit, the signal consists of a pure direct component.

The switching threshold $I_S$ of the transformer lies above the direct-current offset $I_{Smin}$.

With an active input signal $I_e > I_S$, the modulated signal $I_M$ changes synchronously with the alternating signal above or below the current switching threshold $I_S$ of the transformer. The transformer transmits the alternating signal in digitized form.

With an inactive input signal $I_e < I_S$, the input current $I_e$ is statically below the switching threshold $I_S$. The transformer transmits a static signal that corresponds to the safe state.

4.2) Drift Detection:

A hazardous situation occurs when the switching threshold $I_S$ of the modulator falls below the safety-oriented maximum switch-off level $I_{Lmax}$ as a result of drift (component error). As a result, owing to the excessively high sensitivity of the transformer, an inactive input signal $I_e < I_{Lmax}$ could be misinterpreted as an active signal, which could give rise to a hazardous state.

In the arrangement described above, the switching threshold $I_S$ in this fault scenario would lie below the direct-current offset $I_{Smin}$. As a result, the transformer transmits a static signal that can be utilized to detect the component error.

4.3) Examples of the Implementation of the Transformer:

Suitable transformers are electronic arrangements that implement a switching threshold, such as:
- optocouplers,
- transistors,
- difference amplifiers.

4.4) Example of the Implementation of the Modulator:

FIG. 14 shows an example of an implementation of the modulator. At low currents ($I_e < I_{Smin}$), the input current $I_e$ flows first completely as direct current via the resistor R1. The transistor T1 is completely blocked. If the input current $I_e$ rises above the lower limit of the tolerance range of the switching threshold $I_e > I_{Smin}$, then the transistor T1 starts to conduct and allows T2 to discharge part of the input current to the ground. The transistor T2 is actuated by a synchronizing pulse generator. If T2 is blocked, the current $I_e$ is relayed completely to the transformer. If T2 is conductive, T1 limits the modulated signal $I_M$ to $I_{Smin}$ by discharging current to the transformer. This results in a current with a direct-current offset $I_{Smin}$ and an alternating component $I_e - I_{Smin}$.

4.5) Examples of the Modulation Method:

All alternating signals are suitable for the modulation, such as:
- sinusoidal alternating voltages,
- digital clock pulses, or
- encoded signals.

5) Protecting the Switching Threshold:

Conventional interfaces usually define the signal states not only via the current but also via the voltage of the signal.

The above-mentioned arrangement can be expanded in such a way that not only a minimum current switching threshold but also a minimum voltage switching threshold $U_{Tmax}$ can be monitored in a safety-oriented manner.

Figure 15:
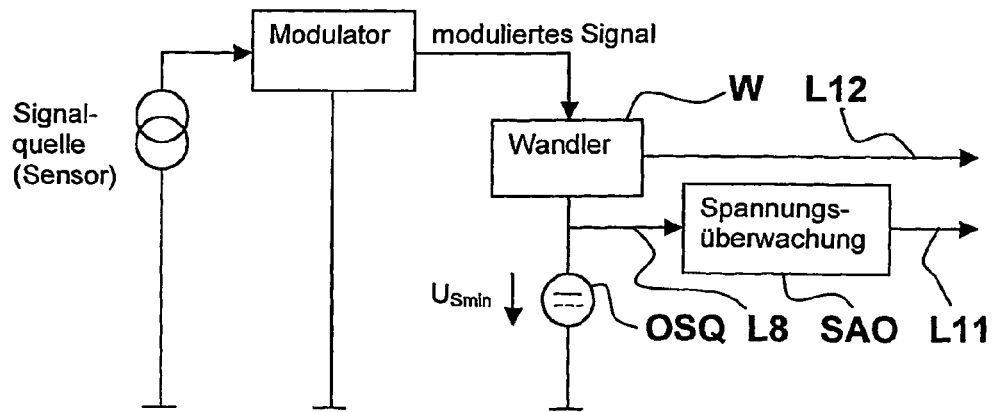
FIG. 15—a block diagram of another embodiment of a circuit that operates on the basis of the method according to the invention, which, in comparison to that of FIG. 12, has been expanded by one voltage switching threshold or by one voltage source and one voltage monitoring unit.

FIG. 15 shows a block diagram with an expansion by one voltage switching threshold.

In order to ensure a minimum voltage switching threshold, the transformer is connected to a higher reference potential rather than to the ground. This reference potential $U_{Smin}$ is equal to or lies above the requisite minimum voltage switching threshold $U_{Tmax}$. Since the input signal is still related to the ground, a current can only flow through the transformer once the input voltage $U_{Smin}$ is exceeded. Depending on the safety requirements, the voltage $U_{Smin}$ can also be reliably monitored.

The modulated current signal $I_M$ can be equal to or be equivalent to the modulation signal S3'. By the same token, the static input current $I_e$ can be equal to or be equivalent to the current output value I1. Likewise, the direct-current offset $I_{Smin}$ can be equal to or be equivalent to the current test value I2. By the same token, the current switching threshold $I_S$ can be equal to or be equivalent to the switching threshold SwI. By the same token, the maximum switch-off level $I_{Lmax}$ can be equal to or be equivalent to the current quiescent signal $I_{quiescent}$. Preferably, $I_e = I1$, $I_{Smin} = I2$, $I_S = SwI$ and $I_{Lmax} = I_{quiescent}$. The "clock pulse" component or circuit shown in FIG. 14 can be identical to or equivalent to the synchronizing pulse generator T shown in FIG. 16.

The switching transducer or transformer W shown in FIG. 15 can be, for example, an optocoupler that emits a switching output signal to an evaluation unit (not shown in FIG. 15) via a line L12 in the manner elaborated upon above, and the switching threshold of this switching output signal is monitored for drift in the manner according to the invention as already explained above, namely by monitoring the switching output signal for pulsation. The modulator shown in FIG. 15 can consist, for instance, of the modulator MD' shown in FIG. 6; by the same token, the signal source shown in FIG. 15 can consist of the sensor S' shown in FIG. 6. The transformer W shown in FIG. 15 can consist of the optocoupler OK shown in FIG. 6. The evaluation unit (not shown in FIG. 15) connected to the line L12 can consist of the evaluation unit A shown in FIG. 6.

The circuit shown in FIG. 15 has been expanded in comparison to that of FIG. 12 by one offset voltage source OSQ and by one voltage monitoring unit that serves to monitor the offset voltage $U_{Smin}$ provided by the offset voltage source OSQ for drift, that is to say, according to the invention, the circuit shown in FIG. 15 is used to monitor not only the switching threshold of the transformer W for drift, but also to monitor the offset voltage $U_{Smin}$ for drift.

The offset voltage source OSQ is interconnected between the transformer W and the ground, that is to say, the transformer W is connected to the ground via the offset voltage source OSQ, as a result of which the switching threshold of the transformer W shifts by the offset voltage $U_{Smin}$ (but it is still monitored in the manner according to the invention as explained above). The magnitude of the offset voltage $U_{Smin}$ can be predefined, for example, by means of an interface definition, by a norm or by an industry standard.

A line L8 branches off from the connection between the transformer W and the offset voltage source OSQ and via this line L8, the offset voltage $U_{Smin}$ is applied to a circuit arrangement SAO. The latter serves to monitor the offset voltage $U_{Smin}$ for drift in the manner according to the invention. An embodiment of such a circuit arrangement SAO is shown in FIG. 17; of course, other embodiments are likewise possible.

Figure 17:
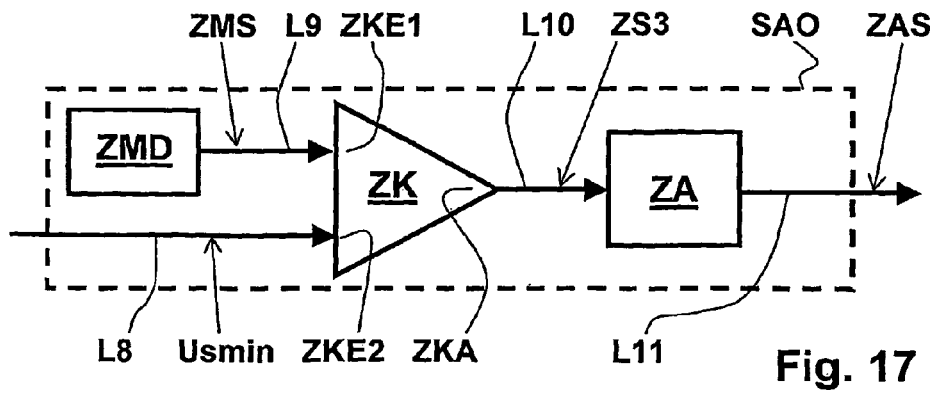
FIG. 17—a circuit arrangement with an additional modulator and an additional comparator for monitoring the voltage source shown in FIG. 15 for drift.

The circuit arrangement SAO shown in FIG. 17 comprises an additional modulator ZMD, an additional switching transducer ZK which, in the present example, is configured as a comparator ZK, and an additional evaluation unit ZA.

The offset voltage $U_{Smin}$ is applied to the reference input ZKE2 of the comparator ZK via the line L8, thus forming or providing the switching threshold of the comparator ZK. The desired value for the offset voltage $U_{Smin}$ (i.e. its target value) is given by a value $U_{Smintarget}$ (FIG. 18).

Figure 18:
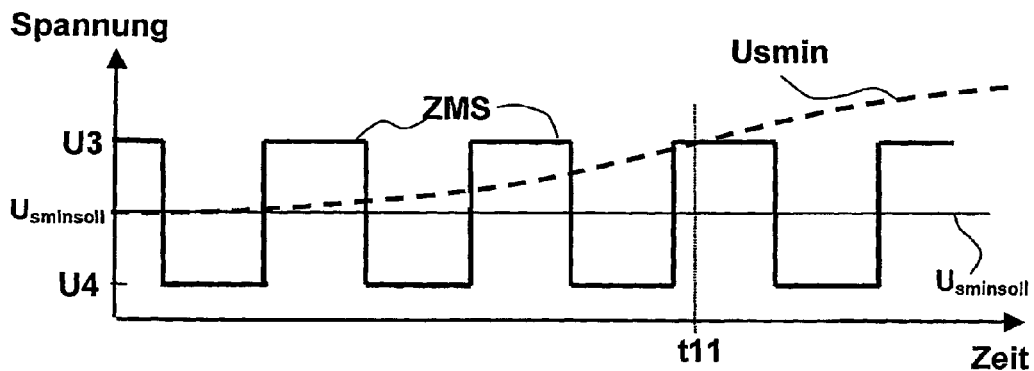
FIG. 18—in each case, an example of the time characteristic of the modulator voltage that the additional comparator shown in FIG. 17 provides as well as an example of the time characteristic of a voltage exhibiting a strong drift.

An additional modulator signal ZMS—which is generated by the additional modulator ZMD and which changes continuously or cyclically between an output value U3 that is greater than the target value $U_{Smintarget}$ and a test value U4 that is smaller than the target value $U_{Smintarget}$—is applied to the signal input ZKE1 of the comparator ZK via a line L9 (FIG. 18).

The comparator ZK—via its switching output ZKA and a line L10—emits an additional switching output signal ZS3 that takes on a value W3 if the additional modulator ZMS is greater than the switching threshold of the additional switching transducer ZK, and otherwise, it takes on a value W4.

Figure 19:
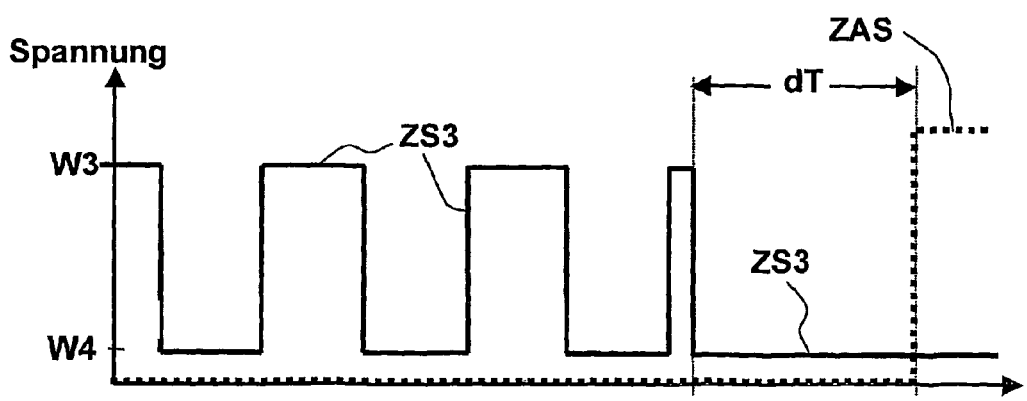
FIG. 19—in each case, an example of the time characteristic of the switching output voltage that the additional comparator shown in FIG. 17 provides as well as an example of the time characteristic of the alarm signal emitted by the circuit arrangement shown in FIG. 17, whereby the time axis shown in FIG. 19 matches that of FIG. 2.

For this reason, the additional switching output signal ZS3 then pulsates synchronously with the additional modulator switching signal ZMS between the values W3 and W4 when the switching threshold $U_{Smin}$ of the comparator ZK is between the values U3 and U4, in other words, within a tolerance range delimited by the values U3 and U4, and thus deviates from the target value $U_{Smintarget}$ at the most by a predefined difference; otherwise, namely, if the switching threshold $U_{Smin}$ is outside of this tolerance range, the additional switching output signal ZS3 does not pulsate (FIG. 19).

At a point in time t11, due to a drift, the voltage $U_{Smin}$ exceeds the value U3 (FIG. 18), thus leaving the tolerance range delimited by the values U3 and U4, so that the additional switching output signal ZS3 stops pulsating at point in time t11 (FIG. 19).

The line L10 (FIG. 17) feeds the additional switching output signal ZS3 to the additional evaluation unit ZA that monitors the additional switching output signal ZS3 for pulsation and triggers an additional alarm signal ZAS (FIG. 19) and emits it via the line L11 when the additional switching output signal ZS3 does not pulsate for at least a predefined waiting time period or test time period dT. This time period is longer than the maximum pulse duration of the signal ZS3 and ends at the point in time t12=t11+dT, which is why the additional alarm signal ZAS is triggered at this point in time (FIG. 19).

In the manner according to the invention, the circuit arrangement SAO monitors the switching threshold of the comparator ZK for deviation from the target value $U_{Smintarget}$. Since this switching threshold is determined by the offset voltage $U_{min}$, the offset voltage $U_{Smin}$ is also monitored according to the invention with the switching threshold. The circuit arrangement SAO is thus concurrently a circuit arrangement for monitoring a voltage, here the voltage $U_{Smin}$, for drift. Since current signals can be converted into voltage signals, the circuit arrangement SAO can also be utilized to monitor a current signal for drift. These statements also apply to the circuit shown in FIG. 1.

The circuit arrangement SAO shown in FIG. 17 can be employed within the circuit arrangement shown in FIG. 15. Generally speaking, all of the voltage and current signals within a circuit for carrying out the method according to the invention can be monitored for drift by another such circuit. A circuit for carrying out the method according to the invention can generally serve to monitor any desired electric signals for drift.

Now reference will be made to FIGS. 20 to 22. The circuit shown in FIG. 20 serves to monitor an electric signal UF—which, in the present example, is a voltage signal UF, referred to below as an external signal—for deviation from a target voltage $UF_{target}$, and it has an evaluation unit A5, a modulator MD5 and a switching transducer K5.

The switching transducer K5 is a comparator at whose reference input K5E2 a reference voltage $U_{ref}5$ is applied via a line L12, said reference voltage prescribing the switching threshold of the comparator K5 (i.e. the switching threshold is unambiguously specified by the reference voltage; in the present example, the switching threshold is identical to the reference voltage). In the present example, the voltage $U_{ref}5$ is smaller than the target value $UF_{target}$ and is provided by a voltage source (not shown here).

A signal source (not shown here) is upstream from the modulator MD5 and this signal source emits a source signal—namely the external signal UF that is to be monitored for deviation from the target voltage $UF_{target}$—to the modulator MD5.

Figure 21:
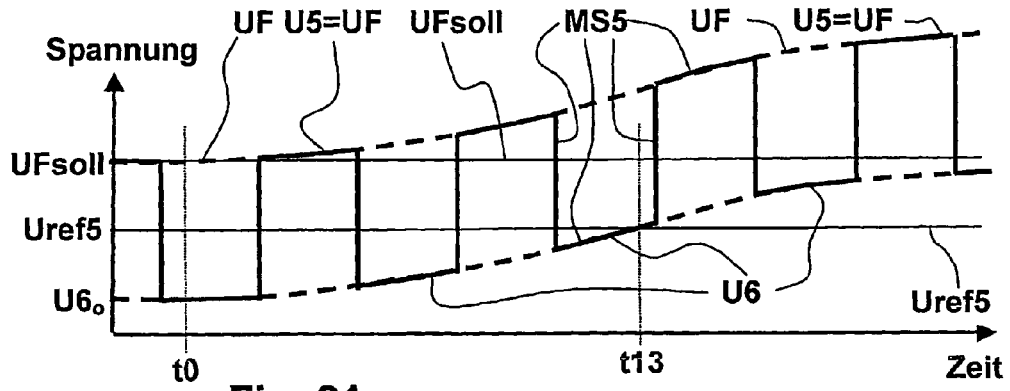
FIG. 21—in each case, an example of the time characteristic of the modulator voltage that the modulator shown in FIG. 20 provides as well as an example of the time characteristic of a voltage exhibiting a strong drift, while tracking or accompanying the modulator signal.

Via a line L14, the modulator MD5 emits a modulator signal MS5 to the signal input K5E1 of the comparator K5, said modulator signal changing continuously between an output value U5 and a test value U6 (FIG. 21). The output value U5 and the test value U6 constitute the limits of a tolerance range for the reference voltage $U_{ref}5$. The modulator MD5 is configured in such a way that the output value U5 is equal to the external signal UF, and the switching threshold $U_{ref}5$ lies within the tolerance range, at least at a starting point in time t0. At the starting point in time t0, the test value U6 has the value $U6_0$. The external signal UF has the target value $UF_{target}$ at the starting point in time t0 (FIG. 21).

The modulator MD5 generates the modulator signal MS5 in that, as the output value U5, it emits the external signal UF—in a continuous time sequence in an alternating and unchanging form—to the signal input K5E1 of the switching transducer K5, so that UF=U5, and it emits the external signal UF—attenuated to the test value U6—to the signal input K5E1 of the switching transducer K5, so that the test value U6 is predefined by the attenuated external signal, and U6<UF. Preferably, the modulator MD5 attenuates the external signal U5 in order to generate the test value U6 by a predefined amount so that the difference UF−U6 remains constant. According to another embodiment, the modulator MD5 attenuates the external signal UF to a certain fraction in order to generate the test value U6. Preferably, the modulator MD5 always generates the test value U6 in such a manner that, when the external signal UF rises, the test value U6 also rises, and when the external signal UF drops, the test value U6 also drops.

Via a line L15, the comparator K5 emits a switching output signal S5 that takes on a first value W5 if the modulator signal MS5 is greater than the switching threshold $U_{ref}5$, and otherwise, it takes on a second value W6.

Figure 22:
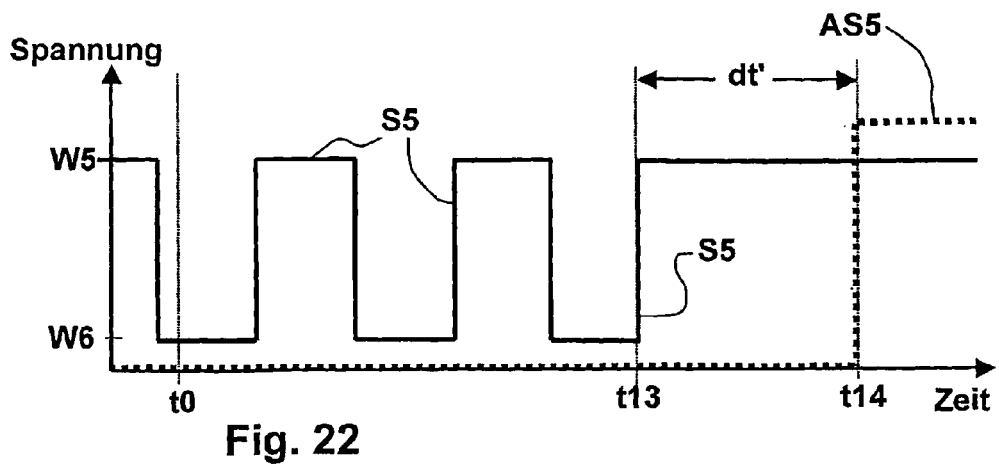
FIG. 22—in each case, an example of the time characteristic of the switching output voltage that the comparator shown in FIG. 20 provides as well as an example of the time characteristic of the alarm signal emitted by the circuit shown in FIG. 20, whereby the time axis shown in FIG. 21 matches that of FIG. 22.

For this reason, the output signal S5 then pulsates synchronously with the modulator signal MS5 between the first and the second value W5, W6 when the switching threshold $U_{ref}5$ is within the tolerance range, and therefore the signal UF deviates from the target value $UF_{target}$ at the most by a predefined tolerance (FIG. 22). Otherwise, the output signal S5 does not pulsate.

The evaluation unit A5 monitors the output signal S5 for pulsation and triggers an alarm signal AS5 if the output signal S5 does not pulsate for at least a predefined test time period dt'. Therefore, the alarm signal AS5 indicates that the tolerance range no longer encompasses the switching threshold $U_{ref}5$ and thus that the electric signal U5 deviates from the target value $U5_{target}$ by more than the predefined tolerance.

At the point in time t0, the external signal UF that is to be monitored for drift is at the target value $UF_{target}$ and the test value U6 is at the value $U6_0$. The reference voltage $U_{ref}5$ in the vicinity of the point in time to is between these values. This is why the switching output signal S5 pulsates in the vicinity of the point in time t0 (FIG. 22).

In the example shown in FIG. 21, the external signal UF that is to be monitored, and thus also the upper limit U5 of the tolerance range, however, rise over the course of time due to a drift. As a result, the test value U6 rises as well, which means that the tolerance range in FIG. 21 shifts upwards over the course of time, that is to say, according to the invention, it accompanies the drift of the signal UF that is to be monitored.

At a point in time t13, the test value U6 exceeds the threshold value $U_{ref}5$, so that the pulsation of the switching output signal S5 stops. The evaluation unit A5 monitors the switching output signal S5 for pulsation and triggers an alarm signal AS5 if the switching output signal S5 does not pulsate for a test time period dt'. Thus, in the example shown in FIGS. 20 to 22, at a point in time t14=t13+dt', the alarm AS5 is triggered, indicating that the signal UF to be monitored has deviated from its target value $UF_{target}$ by more than a certain amount.

Figure 20:
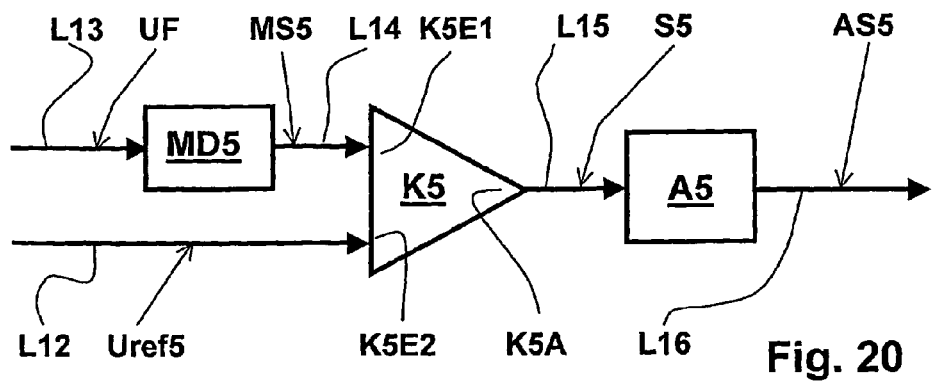
FIG. 20—a circuit for monitoring an electric signal for drift, comprising a modulator, a comparator and an evaluation unit.

Therefore, according to the invention, the circuit shown in FIG. 20 accompanies the tolerance range of the signal UF that is to be monitored for drift, whereby the switching threshold $U_{ref}5$ is kept constant so that it no longer is within the tolerance range and therefore the alarm is triggered when the signal UF deviates from the target value $UF_{target}$ by more than a certain amount.

The broken lines in FIG. 21 form an envelope of the square-wave pulsating modulator signal MS5 that follows the drift or accompanies it according to the invention. The time sequence of the pulses of the modulator signal is fast in comparison to the speed of change of the external signal UF.

In a completely corresponding manner, according to the invention, the external signal UF is monitored by means of the circuit shown in FIG. 20 not only for an increase (upward drift) but also for a decrease (downward drift)—as shown in FIGS. 21 and 22—since, as soon as the external signal UF falls below the reference value $U_{ref}5$ (FIG. 21), the pulsation of the switching output signal S5 likewise stops.

In a completely corresponding manner, instead of the voltage signal UF, a current signal can be monitored for drift. One way to do this consists of converting the current signal into a voltage signal and then handling it in the same manner as explained with reference to FIGS. 20 to 22. Another possibility consists of replacing the comparator K5 with a switching transducer having a current switching threshold (for example, an optocoupler), and replacing the modulator MD5 with one that, instead of alternatingly providing the voltage output value U5 and the voltage test value U6 to the switching transducer, alternatingly provides a current output value and a current test value to the switching transducer, whereby its switching threshold is between the current output value and the current test value, at least at the starting point in time t10.

The reference voltage $U_{ref}5$ and the line L12 can be dispensed with in this case if the switching transducer has an intrinsic switching threshold, which is the case, for instance, with an optocoupler. The modulator can alternatingly emit the current signal that is to be monitored in a constant time sequence in unmodified form to the signal input of the switching transducer, so that the current output value is specified by the unchanged current signal and is emitted in attenuated form to the signal input of the switching transducer, so that the current test value is specified by the attenuated current signal. Preferably, the modulator always generates the current test value in such a way that, when the current signal increases, the current test signal also increases, and when the current signal decreases, the current test value likewise decreases.

LIST OF REFERENCE NUMERALS 1 terminal
A, A5 evaluation units
AS alarm signal
AWS evaluation circuit
B bus
dt, dt', dT test time period
I1 current output value
I2 current test value
IF interface
$I_{quiescent}$ current quiescent signal
$I_{target}$ target current value
K, K5 comparators
KA switching output of K
KE1 signal input of K
KE2 reference input of K
K5A switching output of K5
K5E1 signal input of K5
K5E2 reference input of K5
L1 to L16 lines
MA master
MD, MD', MD", MD5 modulators
MS, MS', MS", MS5 modulator signals
OK, W optocouplers
OKE signal input of OK
OKA switching output of OK
OSQ offset voltage source
R square-wave signal
R1, R2 resistors
SAO switching arrangement
SB current limiter
SCH controllable switch
SL1, SL2 slaves
SL' additional slaves
ST control line
SwI switching threshold of OK
SwU switching threshold of K
S1, S1' source signals
S3, S3', S3", S5 switching output signals
T synchronizing pulse generator
T1, T2 transistors
t0 starting point in time
t1 to t14, t3', t5', t7' points in time
$U_{ref}$, $U_{ref}5$ reference voltages
$U_{quiescent}$ voltage quiescent signal
$U_{Smin}$ offset voltage
$U_{target}$, $U_{Smintarget}$, $U5_{target}$ voltage target values
U1, U3, U5 voltage output values
U2, U4, U6 voltage test values
$U6_0$ value of U6 at point in time t0
W transformer
W1 first value of S3, S3'
W2 second value of S3, S3'
W3, W4 values of ZMS
W5, W6 values of S5
ZA additional evaluation unit
ZAS additional alarm signal
ZK additional switching transducer
ZKA switching output of ZK
ZKE1 signal input of ZK
ZKE2 reference input of ZK
ZMD additional modulator
ZMS additional modulator signal
ZS3 additional switching output signal

The invention claimed is:

1. A method for monitoring whether the switching threshold (SwU, SwI, $U_{Smin}$, $U_{ref}5$) of a switching transducer (K, K5, OK, W, ZK), especially of a comparator (K, K5, ZK), lies within a predefined tolerance range or not, whereby the switching transducer (K, K5, OK, W, ZK)
has a signal input (KE1, OKE, ZKE1) at which an input signal is present, as well as a switching output (KA, OKA, ZKA)
and, via the switching output (KA, OKA, ZKA), it emits a switching output signal (S3, S3', S3", S5, ZS3) that takes on a first value (W1, W3, W5) if the input signal is greater than the switching threshold (SwU, SwI, $U_{Smin}$, $U_{ref}5$), and otherwise, it takes on a second value (W2, W4, W6),
wherein
a) as the input signal, a modulator signal (MS, MS', MS", ZMS, MS5) generated by a modulator (MD, MD', MD", MD5) is used, said modulator signal changing continuously or cyclically between an output value (U1, I1, U3, U5) that specifies the upper limit (U1, I1, U3, U5) of the tolerance range and a test value (U2, I2, U4, U6) that is smaller than the output value (U1, I1, U3, U5) and that specifies the lower limit (U2, I2, U4, U6) of the tolerance range,
so that the switching output signal (S3, S3', S3", ZS3) then pulsates synchronously with the modulator signal (MS, MS', ZMS, MS5) between the first value (W1, W3, W5) and the second value (W2, W4, W6) when the switching threshold (SwU, SwI, $U_{Smin}$, $U_{ref}5$) of the switching transducer (K, K5, OK, W, ZK) lies within the tolerance range, and otherwise, it does not pulsate,
b) and the switching output signal (S3, S3', S3", S5, ZS3) is monitored for pulsation by means of an evaluation unit (A, AWS, MA, ZA), and an alarm signal (AS, ZAS) is triggered if the switching output signal (S3, S3', S3", S5, ZS3) does not pulsate for at least a predefined test time period (dt, dT, dt').

2. The method according to claim 1, wherein
the output value (U1, I1, U3) and the test value (U2, I2, U4) are each kept constant or else each kept constant on the average over time, so that the alarm signal (AS, ZAS) indicates a drift of the switching threshold (SwU, SwI, $U_{Smin}$, $U_{ref}5$) to outside of the tolerance range.

3. The method according to claim 2, wherein
the switching transducer (K, K5, ZK) is a comparator (K, K5, ZK) with a reference input (KE2, K5E2, ZKE2), and the switching threshold is predefined by a reference voltage present at the reference input (KE2, K5E2, ZKE2), so that a drift of the reference voltage brings about a drift of the switching threshold and therefore the alarm signal (AS, ZAS) indicates a drift of the reference voltage by more than a certain tolerance amount.

4. The method according to claim 2, wherein
a target value ($U_{target}$, $I_{target}$) is predefined for the switching threshold (SwU, SwI), said target value being smaller than the output value (U1, I1) and greater than the test value (U2, I2).

5. The method according to claim 4, wherein a signal source (S, S') is used that is upstream from the modulator (MD, MD', MD") and, at least at times,
   (i) emits a source signal (S1, S1') to the modulator (MD, MD', MD"), said source signal being greater than the target value ($U_{target}$, $I_{target}$),
   (ii) or emits a source signal to the modulator (MD, MD', MD"), said source signal being smaller than the target value ($U_{target}$, $I_{target}$),
whereby the modulator signal (S2, S2') is only emitted to the signal input (KE1, OKE) of the switching transducer (K, OK, W) by the modulator (MD, MD', MD") when said modulator receives the source signal (S1, S1') from the signal source (S, S').

6. The method according to claim 5, wherein
as the signal source (S, S'), a signal transmitter or a sensor (S, S') is used that can be in an activated or non-activated state,
and that emits the following to the modulator:
either, in Case (i),
    in the non-activated state, it emits the source signal that is greater than the target value ($U_{target}$, $I_{target}$),
    and, in the activated state, it emits a quiescent signal ($U_{quiescent}$, $I_{quiescent}$) that does not exceed the target value ($U_{target}$, $I_{target}$),
or, in Case (ii),
    in the non-activated state, it emits the source signal that is smaller than the target value ($U_{target}$, $I_{target}$),
    and, in the activated state, it emits a quiescent signal ($U_{quiescent}$, $I_{quiescent}$) that does not fall below the target value.

7. The method according to claim 5, wherein the modulator signal (S2) is generated in that
the source signal (S1, S1') is emitted by the modulator (MD, MD', MD") either in a continuous or cyclical time sequence consecutively or alternatingly in unchanged form to the signal input (KE1, OKE) of the switching transducer (K, OK, W), so that the output value (U1, I1) is specified by the unchanged source signal (S1, S1'), and the source signal (S1, S1') is emitted by the modulator (MD, MD', MD") in attenuated form to the signal input (KE1, OKE) of the switching transducer (K, OK, W), so that the test value (U2, I2) is specified by the attenuated source signal (S1, S1'),
or, either in a continuous or cyclical time sequence consecutively or alternatingly, the source signal (S1, S1'), which has been attenuated to a first fraction, is emitted by the modulator (MD, MD', MD") to the signal input (KE1, OKE) of the switching transducer (K, OK, W), so that the output value (U1, I1) is specified by the source signal (S1, S1'), which has been reduced to the first fraction, and the source signal (S1, S1'), which has been attenuated to a second fraction, is emitted by the modulator (MD, MD', MD") to the signal input (KE1, OKE) of the switching transducer (K, OK, W), so that the test value (U2, I2), which has been attenuated to the second fraction, is specified by the source signal (S1, S1'), whereby the first fraction is greater than the second fraction.

8. The method according to that claim 5, wherein the source signal (S1, S1') is, at times, attenuated to the test value (U2, I2) by a voltage limiter or by a current limiter (SB), thus generating the test value (U2, I2).

9. The method according to claim 5, wherein the modulator (MD, MD', MD") is supplied with electric energy by the source signal (S1, S1').

10. The method according to claim 5, wherein the digital information contains an identifier that identifies the signal source (S').

11. The method according to claim 5, wherein as the signal source (S, S'), a signal transmitter or a sensor (S, S') is used that can be in an activated or non-activated state,
and that emits the following to the modulator:
either, in Case (i),
    in the activated state, it emits the source signal (S1) that is greater than the target value ($U_{target}$, $I_{target}$),
    and, in the non-activated state, it emits a quiescent signal ($U_{quiescent}$, $I_{quiescent}$) that does not exceed the target value ($U_{target}$, $I_{target}$),
or, in Case (ii),
    in the activated state, it emits the source signal that is smaller than the target value,
    and, in the non-activated state, it emits a quiescent signal that does not fall below the target value.

12. The method according to claim 11, wherein
in Case (i),
    the alarm signal (AS) is also triggered,
    or a message signal is triggered,
    when the signal source (S, S') is in the non-activated state and the switching threshold (SwU, SwI) is smaller than the quiescent signal ($U_{quiescent}$, $I_{quiescent}$),
or in Case (ii),
    the alarm signal (AS) is also triggered,
    or a message signal is triggered,
    when the signal source (S, S') is in the non-activated state and the switching threshold (SwU, SwI) is greater than the quiescent signal ($U_{quiescent}$, $I_{quiescent}$).

13. The method according to claim 12, wherein
in Case (i), the slave (SL1) provides digital message information to the bus (B) when the signal source (S, S') is in the non-activated state and the switching threshold (SwU, SwI) is smaller than the quiescent signal ($U_{quiescent}$, $I_{quiescent}$),
or in Case (ii), the slave provides digital message information to the bus when the signal source is in the non-activated state and the switching threshold is greater than the quiescent signal,
and the alarm signal (AS) or the message signal is triggered by means of the message information.

14. The method according to claim 1, wherein
the switching threshold ($U_{ref}5$) is kept constant or else kept constant on the average over time,
the modulator (MD5) has an input at which an external signal (UF) is present,
and, when the external signal (UF) rises, at least the test value (U6) and thus the lower limit (U6) of the tolerance range are raised,
so that, at the latest when the external signal (UF) has risen by more than a certain amount, the switching threshold ($U_{ref}5$) lies below the tolerance range and thus the alarm signal (AS) is triggered.

15. The method according to claim 14, wherein
either the external signal and the test value are identical to each other,
or the test value (U6) is derived from the external signal (UF) in such a way that, when the external signal (UF)

increases, the test value (U6) also increases, and when the external signal (UF) decreases, the test value (U6) also decreases.

16. The method according to claim 14, wherein an external signal target value ($UF_{target}$) is predefined for the external signal (UF), said external signal target value being greater than the switching threshold ($U_{ref}$5), whereby either
the output value (U5), at least at a starting point in time t0, is equal to the external signal target value ($UF_{target}$) and greater than the switching threshold ($U_{ref}$5),
and the test value (U6), at least at the starting point in time t0, is smaller than the switching threshold ($U_{ref}$5), or
the test value (U6), at least at a starting point in time t0, is equal to the external signal target value ($UF_{target}$) and smaller than the switching threshold ($U_{ref}$5),
and the output value (U5), at least at the starting point in time t0, is greater than the switching threshold ($U_{ref}$5), so that the switching threshold ($U_{ref}$5), at least at the starting point in time t0, lies within the tolerance range.

17. The method according to claim 1, wherein
the switching threshold ($U_{ref}$5) is kept constant or else kept constant on the average over time,
the modulator (MD5) has an input at which an external signal (UF) is present,
and, when the external signal (UF) drops, at least the output value (U5) and thus the upper limit (U5) of the tolerance range are lowered,
so that, at the latest when the external signal (UF) has dropped by more than a certain amount, the switching threshold ($U_{ref}$5) lies above the tolerance range and thus the alarm signal (AS) is triggered.

18. The method according to claim 17, wherein
either the external signal (UF) and the output value (U5) are identical to each other,
or the output value (U5) is derived from the external signal (UF) in such a way that, when the external signal (UF) increases, the output value (U5) also increases, and when the external signal (UF) decreases, the output value (U5) also decreases.

19. The method according to claim 1, wherein
the difference between the output value (U1, U5) and the test value (U2, U6) is kept constant over time or else kept constant on the average over time,
or the difference between the output value (U1, U5) and the test value (U2, U6) is limited to a predefined maximum value,
or the quotient of the output value (U1, U5) and the test value (U2, U6) is kept constant over time or else it is kept constant on the average over time.

20. The method according to claim 1, wherein
an optocoupler (OK, W) or a transistor or an electronic switch or a difference amplifier
or else a comparator (K) with a reference input (KE2) at which a reference voltage ($U_{ref}$) is present in order to specify the switching threshold (Sw)
is used as the switching transducer.

21. The method according to claim 1, wherein
a signal source is used that is upstream from the modulator (MD5) and that emits a source signal to the modulator (MD5) that is equal or proportional to the output value (U5), or that is equal or proportional to the test value (U6).

22. The method according to claim 1, wherein as the modulator signal (MS, MS'), the modulator (MD, MD', MD") generates a digital signal in which the output value (U1, I1) and the test value (U2, I2) alternate with each other in a time sequence, whereby
either the high state of the digital signal is present when the magnitude of the modulator signal (MS, MS') is equal to the output value (U1, I1), and the low state of the digital signal is present when the magnitude of the modulator signal (MS, MS') is equal to the test value (U2, I2),
or vice versa,
and a bit pattern and thus digital information are encoded in the time sequence of the output value (U1, I1) and of the test value (U2, I2).

23. The method according to claim 1, wherein the switching transducer (W) can be connected to the ground via an offset voltage source (OSQ), whereby the offset voltage source (OSQ) emits an offset voltage ($U_{Smin}$) and, as a result, the switching threshold of the switching transducer (W) is shifted by the amount of the offset voltage ($U_{smin}$).

24. The method according to claim 23, wherein the offset voltage ($U_{Smin}$) is monitored by a method.

25. The method according to claim 1, wherein
a bus (B), especially a field bus or an interface bus (B), as well as a master (MA) connected to it are used, whereby the modulator (MD") and the switching transducer (OK) are components of a slave (SL1) that is likewise connected to the bus (B), and, at least at times,
the switching output signal (S3')
or the information as to whether the switching output signal is equal to the first value (K1) or to the second value (K2),
or the information as to whether the switching output signal (S, S') is pulsating or not,
is provided in digital form by the slave to the bus (B).

26. The method according to claim 25, wherein,
by means of the master (MA),
the switching output signal (S3, S3')
or the information as to whether the switching output signal is equal to the first value (K1) or to the second value (K2),
or the information as to whether the switching output signal (S, S') is pulsating or not,
is read and evaluated via the bus (B).

27. The method according to claim 25, wherein
furthermore, an evaluation circuit (AWS) is used that is likewise connected to the bus (B) and by means of which
the switching output signal (S3, S3'),
or the information as to whether the switching output signal is equal to the first value (Ki) or to the second value (K2),
or the information as to whether the switching output signal (S, S') is pulsating or not,
is read and evaluated via the bus (B).

28. The method according to claim 25, wherein an output slave (SL2) is used that is likewise connected to the bus (B), whereby, if the switching output signal (S3, S3') does not pulsate for at least the predefined test time period (dt), the master (MA) or the evaluation circuit (AWS) sends, via the bus (B), a control command to the output slave (SL2) by means of which said output slave (SL2) is prompted to emit the alarm signal (AS).

* * * * *